(12) United States Patent
Zhu et al.

(10) Patent No.: US 8,476,139 B2
(45) Date of Patent: Jul. 2, 2013

(54) HIGH PERFORMANCE MOSFET

(75) Inventors: Huilong Zhu, Poughkeepsie, NY (US); Jing Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,476

(22) Filed: Sep. 13, 2012

(65) Prior Publication Data

US 2013/0011981 A1 Jan. 10, 2013

Related U.S. Application Data

(60) Division of application No. 12/754,250, filed on Apr. 5, 2010, now Pat. No. 8,299,540, which is a continuation of application No. 11/867,266, filed on Oct. 4, 2007, now Pat. No. 7,704,844.

(51) Int. Cl.
*H01L 21/336* (2006.01)
*H01L 27/06* (2006.01)
*H01L 21/02* (2006.01)

(52) U.S. Cl.
USPC .... 438/302; 257/370; 257/408; 257/E29.266; 257/E21.435

(58) Field of Classification Search
USPC ............. 438/52–53, 228, 302, 525; 257/197, 257/273, 300, 368–376, 408, E27.015, E29.266, 257/E21.059, E21.435; 427/523; 216/2
See application file for complete search history.

(56) References Cited

U.S. PATENT DOCUMENTS

| 5,618,688 | A  | 4/1997  | Reuss et al.    |
|-----------|----|---------|-----------------|
| 6,180,978 | B1 | 1/2001  | Chatterjee et al. |
| 6,284,578 | B1 | 9/2001  | Ni              |
| 6,548,842 | B1 | 4/2003  | Bulucea et al.  |
| 6,566,204 | B1 | 5/2003  | Wang et al.     |
| 6,599,804 | B2 | 7/2003  | Bulucea et al.  |
| 6,630,710 | B1 | 10/2003 | Augusto         |
| 6,682,996 | B1 | 1/2004  | Blosse          |
| 6,716,687 | B2 | 4/2004  | Wang et al.     |
| 6,797,576 | B1 | 9/2004  | Teng et al.     |
| 6,908,850 | B2 | 6/2005  | Doris et al.    |
| 6,939,751 | B2 | 9/2005  | Zhu et al.      |
| 7,074,656 | B2 | 7/2006  | Yeo et al.      |
| 7,098,477 | B2 | 8/2006  | Zhu et al.      |
| 7,119,369 | B2 | 10/2006 | Wang et al.     |
| 7,145,191 | B1 | 12/2006 | Teng et al.     |

(Continued)

OTHER PUBLICATIONS

Ieong, et al., Selective Epitaxial Channel Ground Plane Thin SOI CMOS Devices, IBM Semiconductor Research and Development Center (SRDC), 2005, Hopewell Junction, NY 12533, IEEE.

(Continued)

*Primary Examiner* — Charles Garber
*Assistant Examiner* — Calvin Choi
(74) *Attorney, Agent, or Firm* — Scully, Scott, Murphy & Presser, P.C.

(57) ABSTRACT

A semiconductor structure which exhibits high device performance and improved short channel effects is provided. In particular, a metal oxide semiconductor field effect transistor (MOFET) is provided that includes a low dopant concentration within an inversion layer of the structure; the inversion layer is an epitaxial semiconductor layer that is formed atop a portion of the semiconductor substrate. The structure also includes a well region of a first conductivity type beneath the inversion layer, wherein the well region has a central portion and two horizontally abutting end portions. The central portion has a higher concentration of a first conductivity type dopant than the two horizontally abutting end portions.

18 Claims, 20 Drawing Sheets

U.S. PATENT DOCUMENTS

| | | |
|---|---|---|
| 7,220,662 B2 | 5/2007 | Zhu et al. |
| 7,262,451 B2 | 8/2007 | Mandelman et al. |
| 2005/0189589 A1 | 9/2005 | Zhu et al. |
| 2006/0197158 A1 | 9/2006 | Babcock et al. |
| 2007/0096144 A1 | 5/2007 | Kapoor |

OTHER PUBLICATIONS

PCT/US2008/78652—Filed Oct. 3, 2008—PCT ISR/WO.

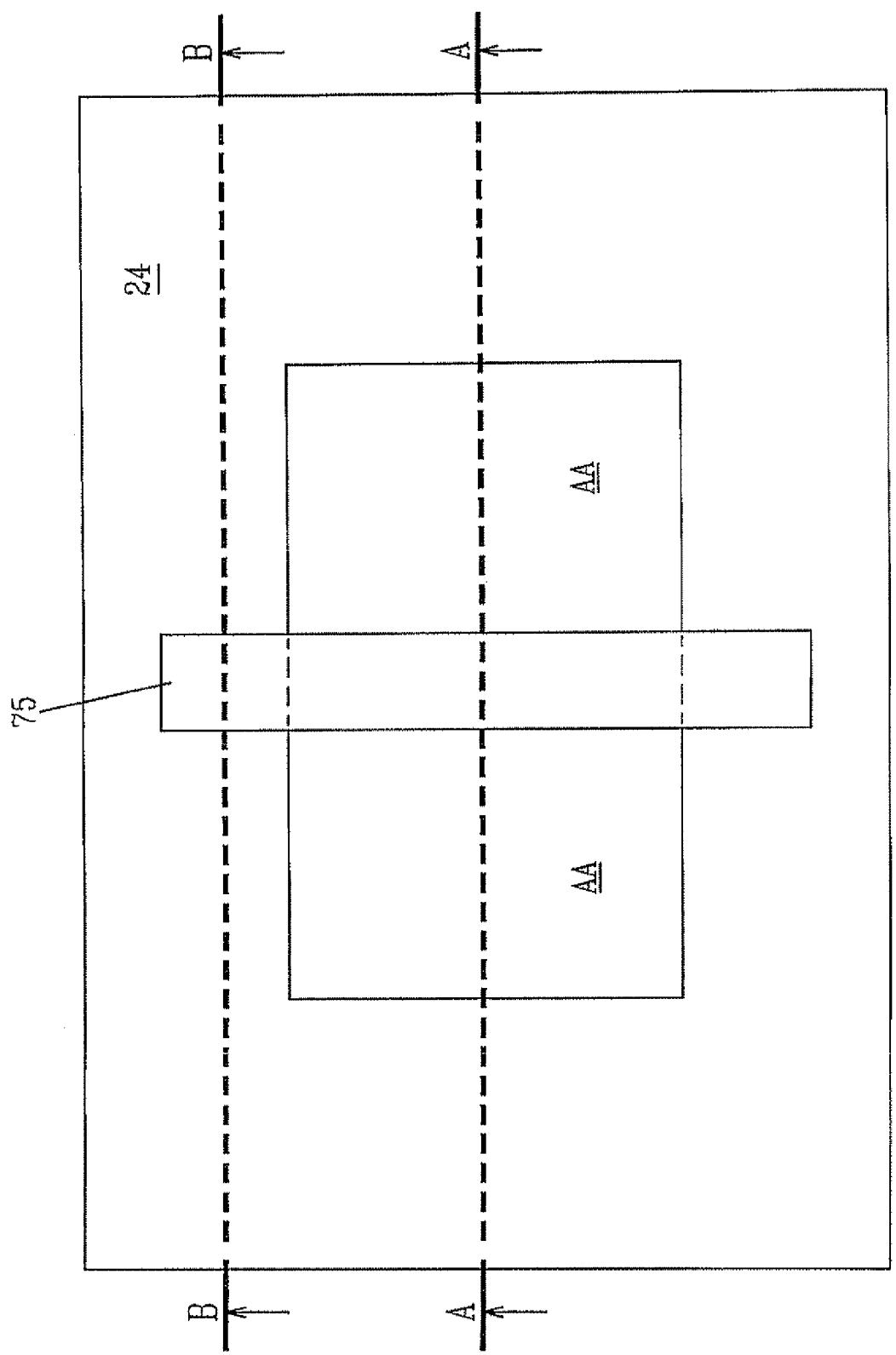

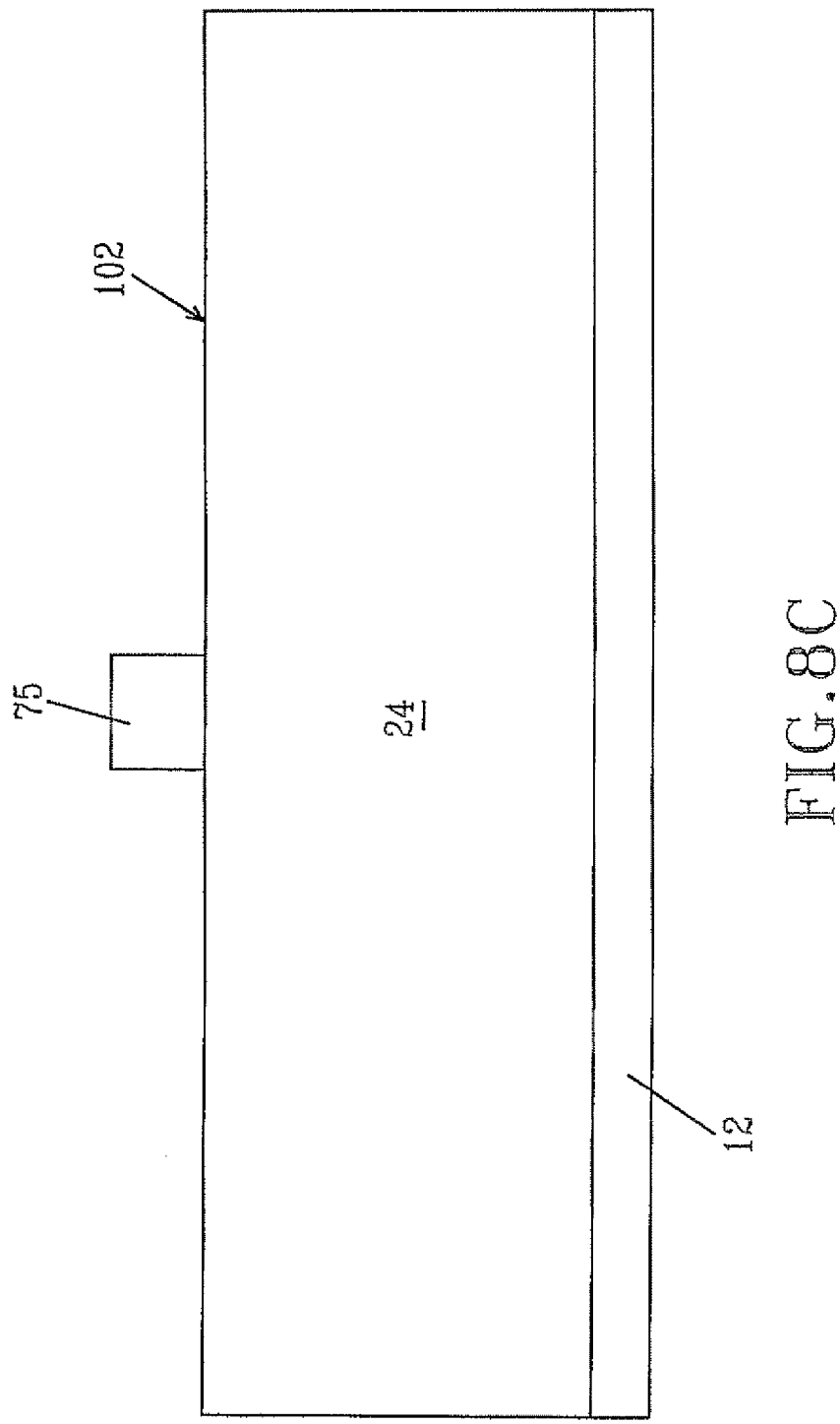

HIGH PERFORMANCE MOSFET

CROSS REFERENCE TO RELATED APPLICATION

This application is a divisional of U.S. patent application Ser. No. 12/754,250 filed on Apr. 5, 2010 which is also a continuation of U.S. patent application Ser. No. 11/867,266, filed Oct. 4, 2007, now U.S. Pat. No. 7,704,844, the entire content and disclosure of which is incorporated herein by reference.

FIELD OF THE INVENTION

The present invention relates to a semiconductor structure and a method of fabricating the same. More particularly, the present invention relates to a metal oxide semiconductor field effect transistor (MOSFET) that exhibits high performance and improved short channel effects. The inventive semiconductor structure also has an improved inverse sub-threshold slope or sub-threshold swing. In another aspect, the present invention also provides a method of fabricating such a MOSFET.

BACKGROUND OF THE INVENTION

Field effect transistors (FETs) are the basic building block of today's integrated circuit. Such transistors can be formed in conventional bulk substrates (such as silicon) or in semiconductor-on-insulator (SOI) substrates.

State of the art metal oxide semiconductor (MOS) transistors are fabricated by depositing a gate stack material over a gate dielectric and a substrate. Generally, the MOS transistor fabrication process implements lithography and etching processes to define the conductive, e.g., poly-Si, gate structures. The gate structure and substrate are thermally oxidized, and, after this, source/drain extensions are formed by implantation. Sometimes the implant is performed using a spacer to create a specific distance between the gate and the implanted junction. In some instances, such as in the manufacture of an n-FET device, the source/drain extensions for the n-FET device are implanted with a thinner spacer than the p-FET device.

A thicker spacer is typically formed after the source/drain extensions have been implanted. The deep source/drain implants are then performed with the thick spacer present. High temperature anneals are performed to activate the junctions after which the source/drain and top portion of the gate are generally silicided. Silicide formation typically requires that a refractory metal be deposited on a Si-containing substrate followed by a process to produce the silicide material. The silicide process forms low resistivity contacts to the deep source/drain regions and the gate conductor.

High integration density can reduce manufacturing costs. In order to be able to make integrated circuits (ICs), such as memory, logic, and other devices, of higher integration density than currently feasible, one has to find a way to further downscale the dimensions of field effect transistors (FETs), such as metal oxide semiconductor field effect transistors. The downscaling of transistor dimensions allows for improved performance as well as compactness, but such downscaling has some device and yield degrading effects. Generation improvements for high performance MOSFETs are obtained by decreasing the line width (i.e., channel length), reducing the gate oxide thickness, and decreasing the source/drain extension resistance. Smaller transistor line width results in less distance between the source and the drain. This results in faster switching speeds for complementary metal oxide semiconductor (CMOS) circuits.

Unfortunately, reducing the channel length of a transistor also increases short channel effects, as well as "edge effects" that are relatively unimportant in long channel transistors. One example of a short channel effect includes, among other aspects, an increased drain-to-source leakage current when the transistor is supposed to be in the "off" or non-conductive state, due to an enlarged drain-to-body and source-to-body junction depletion region relative to the shorter channel length. In addition, one of the edge effects that may also adversely influence transistor performance is the gate-to-source/drain capacitance. A part of this parasitic fringe capacitance can be effectively increased via transistor gain factor, and is known as Miller capacitance. In CMOS applications, the Miller capacitance is an amplification of a gate-to-drain capacitance.

It is known in the semiconductor industry that a halo implantation can be used to control short channel effects. Although halo implantation can help to control short channel effects, the presence of the same in the inversion layer degrades the mobility of the carriers within the inversion layer and oftentimes reduces the device performance. The aforementioned problems with halo implantation are increased with shorter gate lengths since a higher concentration of halo profile is typically needed.

In view of the above, there is a need for providing a new and improved MOSFET structure that exhibits high performance and improved short channel effects.

SUMMARY OF THE INVENTION

In one aspect of the present invention, a semiconductor structure which exhibits high device performance and improved short channel effects is provided. Moreover, the semiconductor structure of the present invention has an improved inverse sub-threshold slope. By 'improved inverse sub-threshold slope' it is meant that the gate electrode has better control of the source/drain current.

In particular, the present invention provides a metal oxide semiconductor field effect transistor (MOSFET) that includes a low concentration of halo implant within an inversion layer of the structure; in the present invention the inversion layer is an epitaxial semiconductor layer that is formed atop a portion of the semiconductor substrate.

The inventive structure also includes a well region of a first conductivity type located beneath the inversion layer, wherein the well region has a central portion and two horizontally abutting end portions, said central portion having a higher concentration of a first conductivity type dopant than the two horizontally abutting end portions. Such a well region may be referred to as a non-uniform super-steep retrograde well. The presence of the well region, i.e., the non-uniform super-steep retrograde well, within the inventive structure improves the short channel effects of the structure.

In general terms, the present invention comprises a semiconductor structure that includes:

a semiconductor substrate having at least one trench isolation region located therein;

an epitaxial semiconductor layer abutting a surface of said semiconductor substrate;

at least one gate stack comprising, from bottom to top, a gate dielectric, a first gate electrode portion and a second gate electrode portion, located on a portion of said epitaxial semiconductor layer; and a well region of a first conductivity type located beneath the epitaxial semiconductor layer, wherein the well region has a central portion and two horizontally abutting end portions, said central portion having a higher concentration of a first conductivity type dopant than the two horizontally abutting end portions, and where each of said two end portions has an outer edge that is in contact with a source/drain diffusion region of a second conductivity type which differs from that of the first conductivity type and where said central portion is located beneath the at least one gate stack.

In the present invention, the well region of first conductivity type may include either an n-type dopant or a p-type dopant, while the source/drain diffusion regions of the second conductivity type have the opposite conductivity. Thus, for example, when the well region of the first conductivity type includes an n-type dopant, then the source/drain diffusion regions include a p-type dopant. Likewise, when the well region of the first conductivity type includes a p-type dopant, an n-type dopant is present within the source/drain diffusion regions.

As indicated above, the central portion of the well region has a higher concentration of first conductivity type dopants than the two horizontally abutting end portions; the two horizontally end portions of the well region also include the first conductivity type dopant. Preferably, the central portion has a dopant concentration from about $10^{18}$ to about $10^{19}$ atoms/cm$^3$, while the two horizontally abutting end portions of the well region have a dopant concentration from about $5 \times 10^{17}$ to about $5 \times 10^{18}$ atoms/cm$^3$. In an even more preferred embodiment of the present invention, the central portion has a dopant concentration from about $2 \times 10^{18}$ to about $7 \times 10^{18}$ atoms/cm$^3$, while the two horizontally abutting end portions of the well region have a dopant concentration from about $10^{18}$ to about $3 \times 10^{18}$ atoms/cm$^3$.

It is observed that the interface between the central portion of the inventive well region and both the two horizontally abutting end portions have a change of first conductivity type dopant concentration that is abrupt, i.e., super-steep. Typically, the dopant concentration at the aforementioned interface changes by a factor of 10 per about 5 to about 10 nm.

In an embodiment of the present invention, the semiconductor structure further includes source/drain extension regions located within the epitaxial semiconductor layer, wherein portions of each of said source/drain extension regions are located vertically abutting an upper surface of each of said two end portions of said well region.

In another embodiment of the present invention, the semiconductor structure further includes a semiconductor alloy layer located within, and/or on, each source/drain diffusion region. Typically, the semiconductor alloy layer is a metal silicide such as, for example, a silicide of nickel, a silicide of titanium or a silicide of cobalt.

In yet another embodiment of the present invention, a semiconductor alloy layer, e.g., a metal silicide, is located on an upper surface of said second gate electrode portion.

In an even further embodiment of the present invention, the at least one gate stack includes at least one spacer located on sidewalls of said first and second gate electrode portions. The at least one spacer is typically located on a surface of the gate dielectric.

In a preferred embodiment of the present invention, a semiconductor structure is provided that comprises:
 a Si-containing semiconductor substrate having at least one trench isolation region located therein;
 an epitaxial Si layer abutting a surface of said Si-containing semiconductor substrate;
 at least one gate stack comprising, from bottom to top, a gate dielectric, a metal gate electrode portion and a polysilicon gate electrode portion, located on a portion of said epitaxial Si layer; and
 a well region of a first conductivity type located beneath the epitaxial Si layer, wherein the well region has a central portion and two horizontally abutting end portions, said central portion having a higher concentration of a first conductivity type dopant than the two horizontally abutting end portions, and where each of said two end portions has an outer edge that is in contact with a source/drain diffusion region of a second conductivity type which differs from that of the first conductivity type and where said central portion is located beneath the at least one gate stack.

In another aspect of the present invention, a method of fabricating a semiconductor structure as mentioned above is provided. The inventive method includes the steps of:
 providing a semiconductor structure having an oxide layer and at least one patterned material stack located on an active area of a semiconductor substrate, said semiconductor substrate having at least one trench isolation region that extends above the surface of said oxide layer;
 performing an angled implantation process which forms a well region of a first conductivity type within the semiconductor substrate at an interface with said oxide layer, wherein the well region has a central portion and two horizontally abutting end portions, said central portion having a higher concentration of a first conductivity type dopant than the two horizontally abutting end portions;
 removing a lower portion of said at least one patterned material stack, while maintaining an upper portion of said at least one patterned material stack;
 removing said oxide layer to expose said semiconductor substrate within said active area;
 forming an epitaxial semiconductor layer on said exposed semiconductor substrate;
 forming a gate dielectric on said epitaxial semiconductor layer and on exposed sidewalls and bottom wall of said upper portion of said at least one patterned material stack;
 forming a first gate electrode portion on a surface of said epitaxial semiconductor layer, wherein a top surface of said first gate electrode portion abuts said gate dielectric on said bottom wall of said upper portion of said at least one patterned material stack;
 removing the upper portion of said at least one patterned material stack and said gate dielectric located on said sidewalls and said bottom wall of said upper portion of said at least one patterned material stack; and
 forming a second gate electrode portion on an upper surface of said first gate electrode portion.

The method of the present invention also includes forming source/drain extension regions in a portion of said epitaxial semiconductor layer not protected by the first and said gate electrode portions.

After forming the source/drain extensions, the method of the present invention further includes forming at least one spacer on exposed sidewalls of said first and second gate electrode portions.

After forming the at least one spacer, the method of the present invention further includes forming source/drain diffusion regions within said semiconductor substrate and said epitaxial semiconductor layer.

After forming the source/drain diffusion regions, the method of the present invention further comprises forming a metal semiconductor alloy layer over at least the source/drain diffusion regions. In embodiments in which the second gate electrode portion comprises a Si-containing conductive material, a metal semiconductor alloy layer can also be formed atop the second gate electrode portion.

DETAILED DESCRIPTION OF THE INVENTION

Figure 1:
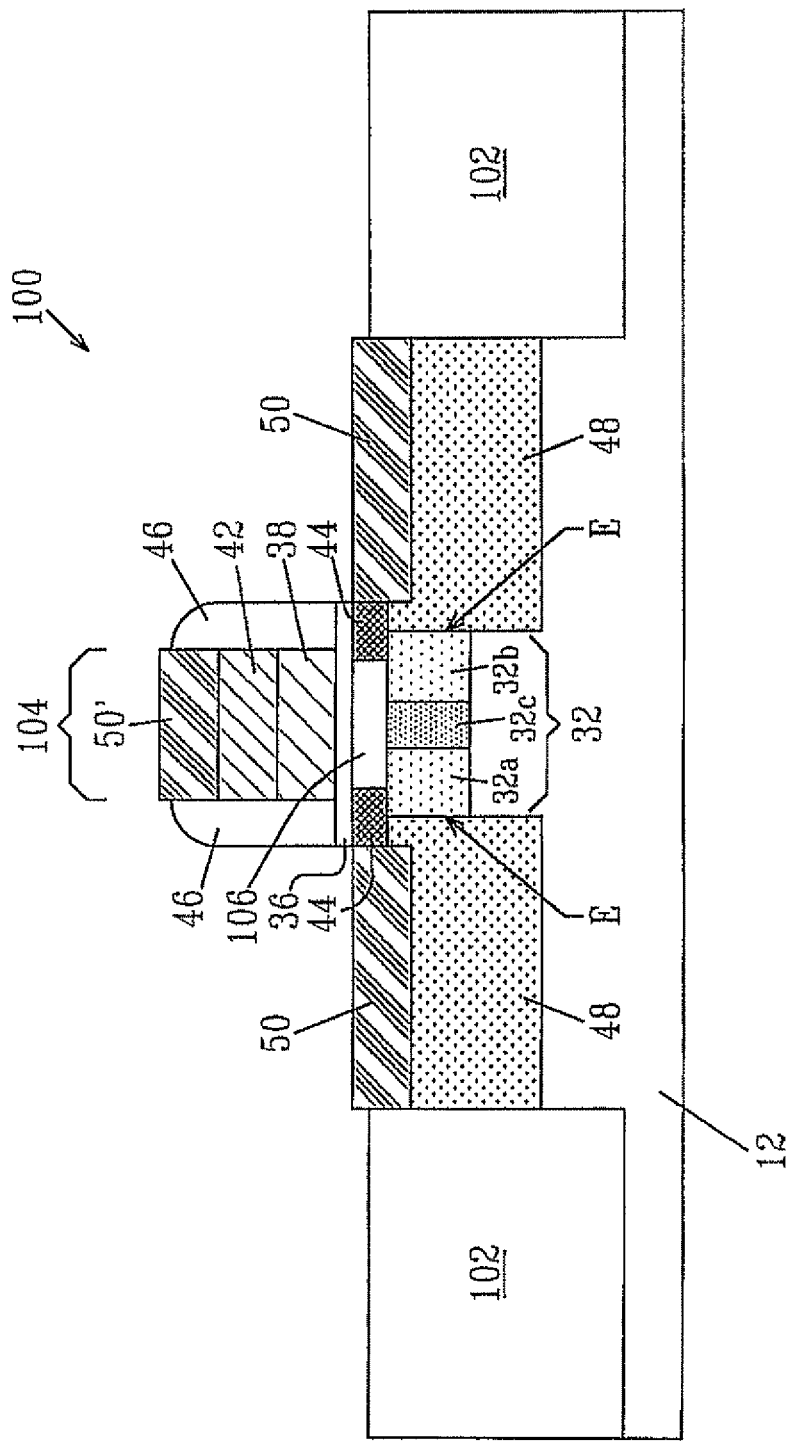
FIG. 1 is a pictorial representation (through a cross sectional view) depicting the semiconductor structure of the present invention.

The present invention, which provides a semiconductor structure that exhibits high performance and improved short channel effects, and a method of fabricating the same, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Before discussing the invention in detail, it is noted that in the drawings that accompany the present invention various views are sometimes shown. In cases where various views are shown, the drawing including the designation "A" is a view looking down on the structure, while the drawing including the designation "B" is a cross sectional view through cut A-A shown in the top down view, i.e., a cross sectional through the active area of the device, while the drawing including the designation "C" is a cross sectional view through cut B-B shown in the top down view, i.e., through the trench isolation region of the structure. When no designation A, B or C is used, the drawing representations a cross sectional view through the active area of the structure.

As stated above, the present invention provides a semiconductor structure which includes a well region of a first conductivity type beneath an inversion layer, e.g., an epitaxial semiconductor layer, that is located on a surface of a semiconductor substrate. The inventive well region has a central portion and two horizontally abutting end portions. The central portion has a higher concentration of a first conductivity type dopant than the two horizontally abutting end portions. Such a well region may be referred to as a non-uniform super-steep retrograde well. The presence of the well region, i.e., the non-uniform super-steep retrograde well, within the inventive structure improves the short channel effects of the structure.

Reference is now made to FIG. 1 which illustrates the inventive semiconductor structure of the present invention. Specifically, FIG. 1 illustrates an inventive semiconductor structure 100 that includes a semiconductor substrate 12 having at least one trench isolation region 102 located therein. An epitaxial semiconductor layer 34 (in the drawing the epitaxial semiconductor layer is not specifically labeled since it includes the device channel 106, the extension regions 44 and the metal semiconductor alloy layer 50) is abutting a surface of semiconductor substrate 12. A portion of the epitaxial semiconductor layer 34 that is located beneath the gate stack 104 serves as the channel 106 of the inventive structure. It is noted that although a single gate stack is shown and described, the present invention works equally well when a plurality of gate stacks are present.

As is shown in FIG. 1, at least one gate stack 104 comprising, from bottom to top, a gate dielectric 36, a first gate electrode portion 38 and a second gate electrode portion 42, is located on a portion of the epitaxial semiconductor layer 34. The gate stack 104 further includes at least one spacer 46 that is located on exposed sidewalls of the first and second gate electrode portions.

A well region 32 of a first conductivity type is located beneath the epitaxial semiconductor layer 34; the well region 32 abuts a lower surface of epitaxial semiconductor layer 34. The well region 32, which has a planar dopant profile, has a central portion 32c and two horizontally abutting end portions 32a and 32b which are located to the left and right of the central portion 32c. The central portion 32c has a higher concentration of a first conductivity type dopant than the two horizontally abutting end portions 32a and 32b. Each of the two end portions 32a and 32b have an outer edge E that is in contact with a source/drain diffusion region 48 of a second conductivity type which differs from that of the first conductivity type. The source/drain diffusion regions 48 are located at the footprint of the at least one gate stack 104 and they are located within both the epitaxial semiconductor layer 34 and the semiconductor substrate 12. As shown, the central portion 32c of the well region 32 is located beneath the gate stack 104; in particular, the central portion 32 is positioned below the device channel 106.

FIG. 1 also includes source/drain extension regions 44 that are located within the epitaxial semiconductor layer 34 (in the drawing the epitaxial semiconductor layer is not specifically shown since it includes the device channel 106, the extension regions 44, and the metal semiconductor alloy layer 50). As shown, some portions of the source/drain extension regions 44 may extend above and onto an upper surface of each of the two end portions 32a and 32b of the inventive well region 32. Metal semiconductor alloy layers 50 and 50' are also shown in FIG. 1.

Figure 2:
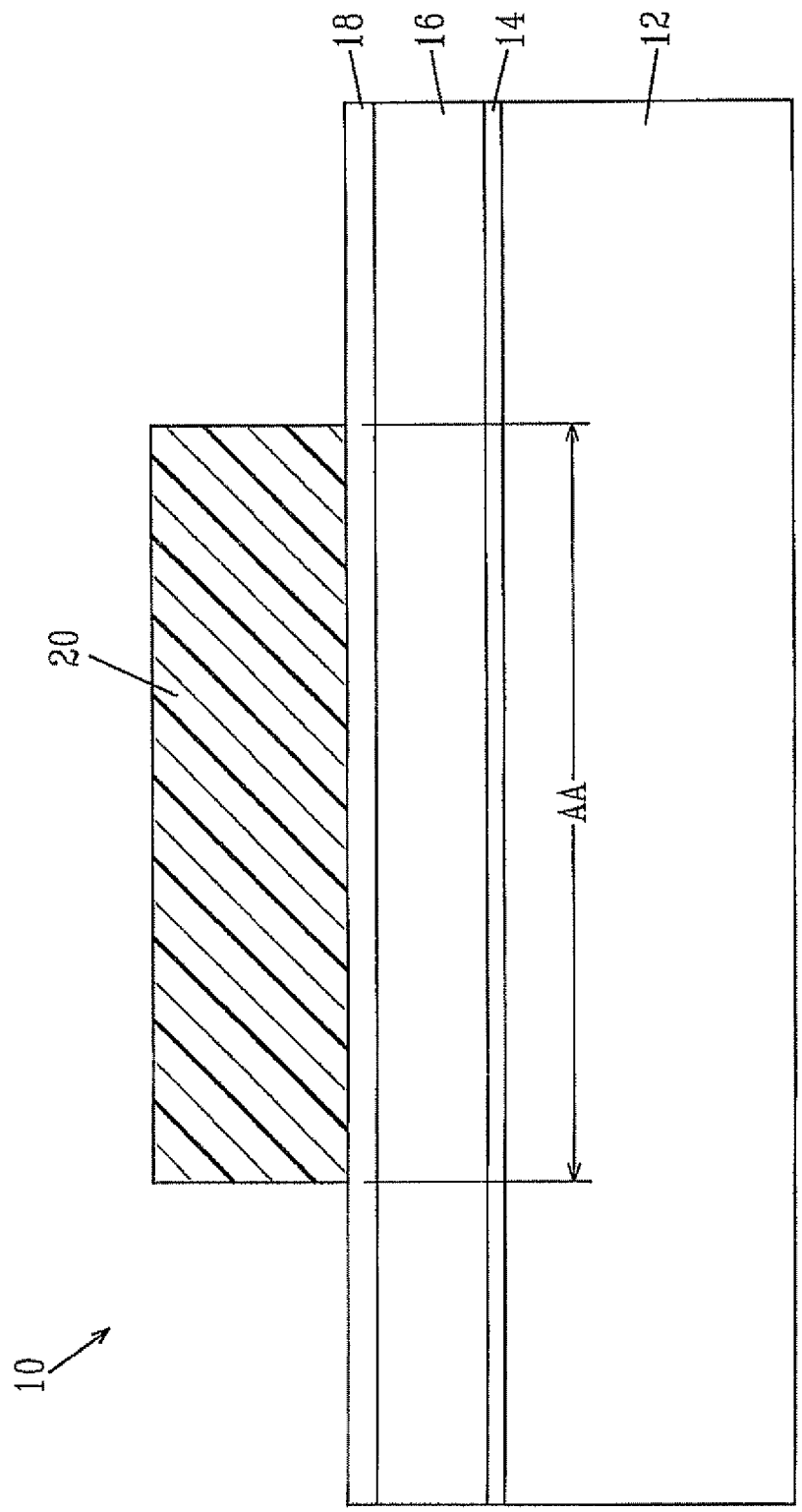
FIGS. 2-15 are pictorial representations (through various views) depicting the basic processing steps that are employed in the present invention in fabricating the semiconductor structure shown in FIG. 1.

Reference is now made to FIGS. 2-15 which illustrate the various processing steps that are employed in fabricating the structure shown in FIG. 1. FIG. 2 shows an initial structure 10 that is employed in the present invention. The initial structure 10 includes a semiconductor substrate 12, an oxide layer 14 located on a surface of the semiconductor substrate 12, a SiGe layer 16 located on a surface of the oxide layer 14, and a first nitride layer 18 located on a surface of the SiGe layer 16. The initial structure 10 also includes a patterned photoresist 20 located on a surface of the first nitride layer 18. It is noted that the width of the patterned photoresist 20 defines the active area AA of the inventive semiconductor structure.

The initial structure 10 shown in FIG. 2 is comprised of materials that are well known to those skilled in the art. Also, conventional techniques are used in forming the same. For example, the semiconductor substrate 12 comprises any semiconductor material including, for example, Si, Ge, SiGe, SiC, SiGeC, Ga, GaAs, InAs, InP and all other III/V or II/VI compound semiconductors. Semiconductor substrate 12 may be a layered semiconductor such as, for example, Si/SiGe, Si/SiGeC, or a semiconductor-on-insulator (SOI). When an SOI substrate is employed, a buried insulator such as, for example, a buried oxide or a buried nitride is located between top and bottom semiconductor layers. The buried insulator may be continuous or it may discontinuous. In some embodiments of the present invention, the semiconductor substrate 12 is a Si-containing substrate, i.e., a semiconductor material that includes silicon. The semiconductor substrate 12 may be doped, undoped or contain regions and/or surfaces that are doped and other regions and/or surfaces that are undoped.

The semiconductor substrate 12 may be strained, unstrained or contain strained regions and unstrained regions therein. The semiconductor substrate 12 may have a single crystal orientation or it may be a hybrid orientation semiconductor substrate that has at least two surfaces regions that have different crystallographic orientations.

Next, oxide layer 14 is formed on the surface of the semiconductor substrate 12 utilizing any conventional deposition process such as, for example, chemical vapor deposition (CVD), plasma enhanced chemical vapor deposition (PECVD), atomic layer or pulsed deposition (ALD or ALPD), evaporation, reactive sputtering, chemical solution deposition or other like deposition processes. Alternatively, the oxide layer 14 is formed by a thermal oxidation process. Combinations of the aforementioned techniques can also be used in forming the oxide layer 14.

The oxide layer 14 is typically, but not necessarily always, an oxide of a semiconductor material. In one embodiment of the present invention, the oxide layer 14 is an oxide of silicon. The thickness of the oxide layer 14 may vary depending on the technique used in forming the same. The thickness of the oxide layer 14 is typically from about 5 to about 50 nm, with a thickness from about 10 to about 20 nm being even more typical.

After forming the oxide layer 14 on the surface of the semiconductor substrate 12, the SiGe layer 16 is formed utilizing a conventional deposition process including, for example, CVD, physical vapor deposition (PVD) or evaporation, atop the oxide layer 14. The SiGe layer 16 is typically, but not necessarily always, polycrystalline. The thickness of the SiGe layer 16 may vary depending on the deposition technique used in forming the same. Typically, the SiGe layer 16 has a thickness from about 10 to about 100 nm, with a thickness from about 30 to about 50 nm being even more typical.

Next, the first nitride layer 18 is formed on a surface of the SiGe layer 16 utilizing a conventional deposition including, for example, CVD, PECVD, evaporation, reactive sputtering, ALD, ALPD or chemical solution deposition. The first nitride layer 18 is typically, but not necessarily always, comprised of a nitride of silicon or an oxynitride of silicon. The thickness of the first nitride layer 18 may vary depending on the technique used in forming the same. The thickness of the first nitride layer 18 is typically from about 10 to about 50 nm, with a thickness from about 20 to about 30 nm being even more typical.

The patterned photoresist 20 is formed by first applying a blank layer of photoresist material (organic, inorganic, or hybrid) on the upper surface of the first nitride layer 18 utilizing a conventional deposition process including, for example, spin-on coating or evaporation. Following the application of the blanket photoresist material to the upper surface of the first nitride layer 18, the blanket layer of photoresist material is subjected to a lithographic step which provides a patterned photoresist 20 as shown in FIG. 2. The lithography step includes exposing the photoresist material to a desired pattern of radiation and developing the exposed photoresist material utilizing a conventional resist developer.

Figure 3:
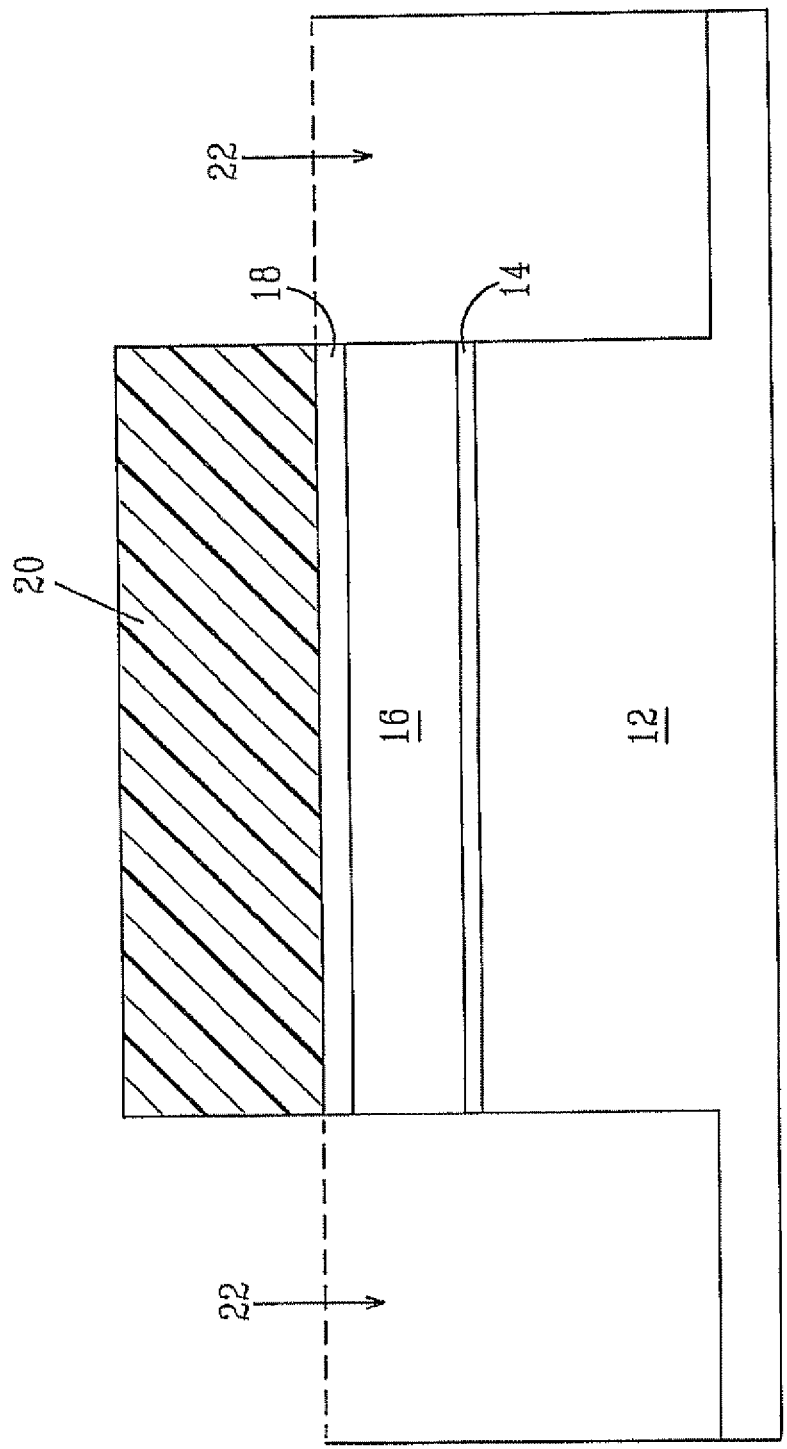

Next, and as shown in FIG. 3, the initial structure 10 shown in FIG. 2 is subjected to an etching process that is capable of removing unprotected portions, not including the patterned photoresist 20, of the first nitride layer 18, the SiGe layer 16, the oxide layer 14, as well as portions of the semiconductor substrate 12. As shown, the etching process forms at least one trench 22 within the structure. Dotted lines are shown in FIG. 3 to represent the trench opening.

The etching process includes dry etching, wet chemical etching or combinations thereof. Preferably, a dry etching process such as, for example, reactive ion etching (RIE), ion beam etching, plasma etching or laser ablation, is used. More preferably, a RIE process is used to provide the at least one trench 22 within the structure.

Figure 4A:
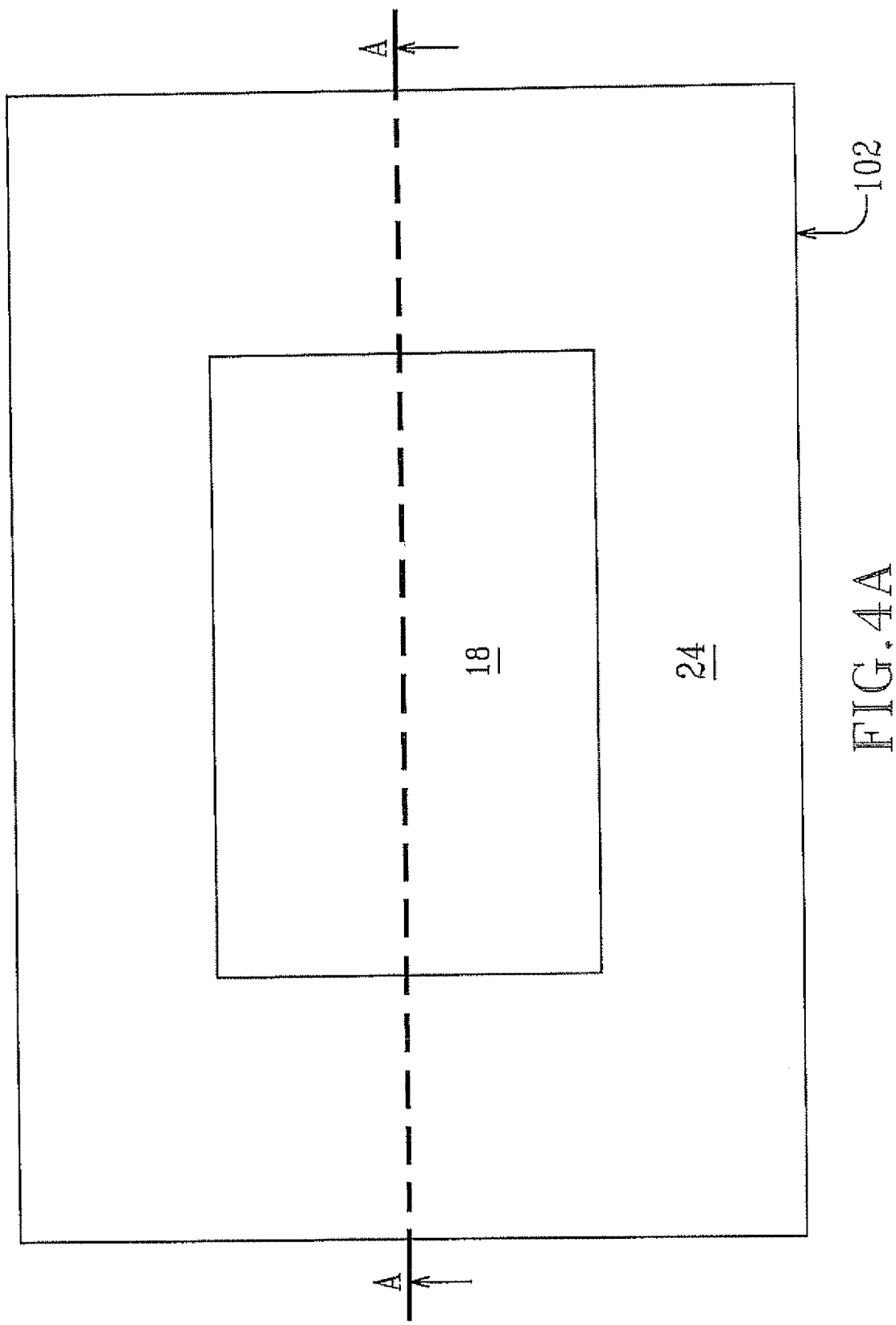

Reference is now made to FIGS. 4A (top down view) and 4B (cross sectional view through line A-A) which illustrates the structure that is formed after removing the patterned photoresist 20, depositing a trench dielectric 24 at least within the at least one trench 22, and planarizing utilizing the remaining first nitride layer 18 as a polish stop layer.

Figure 4B:
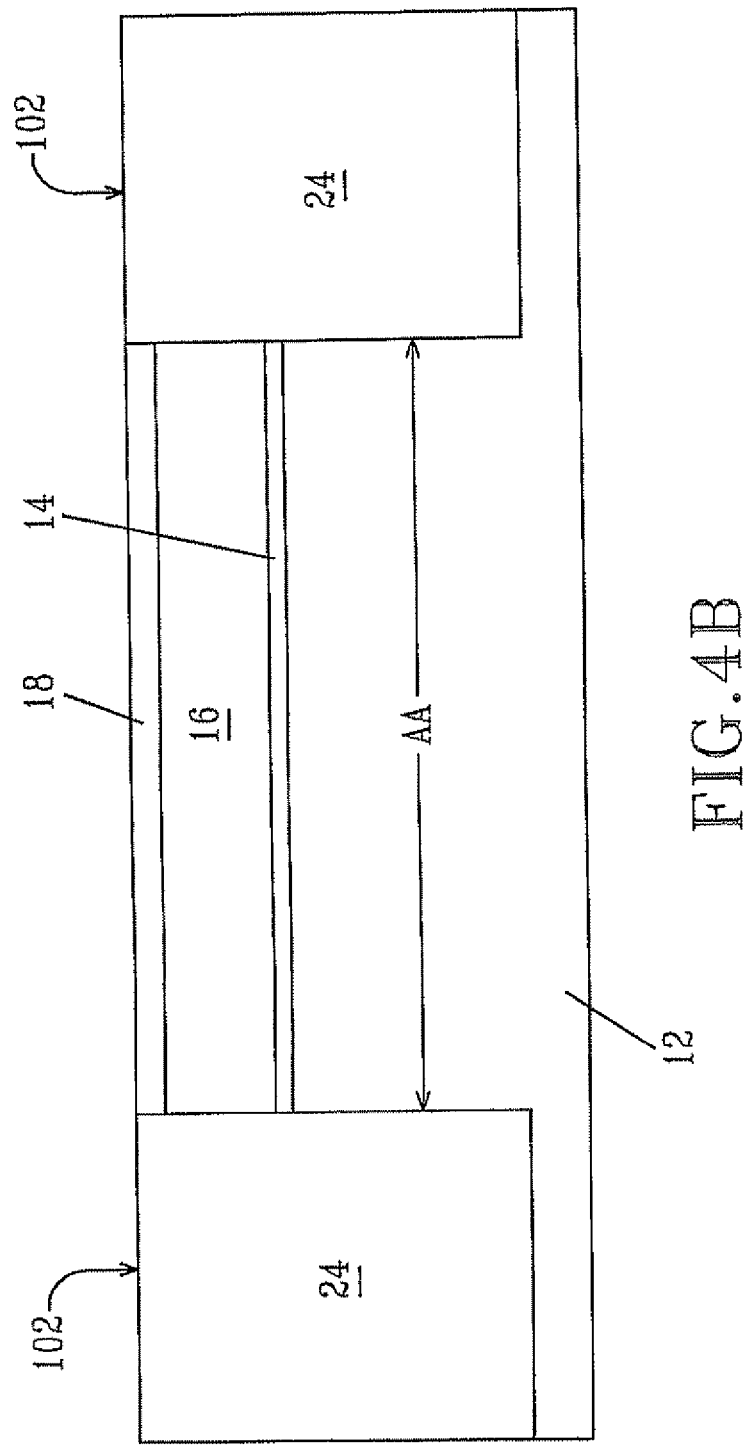
Figure 5A:
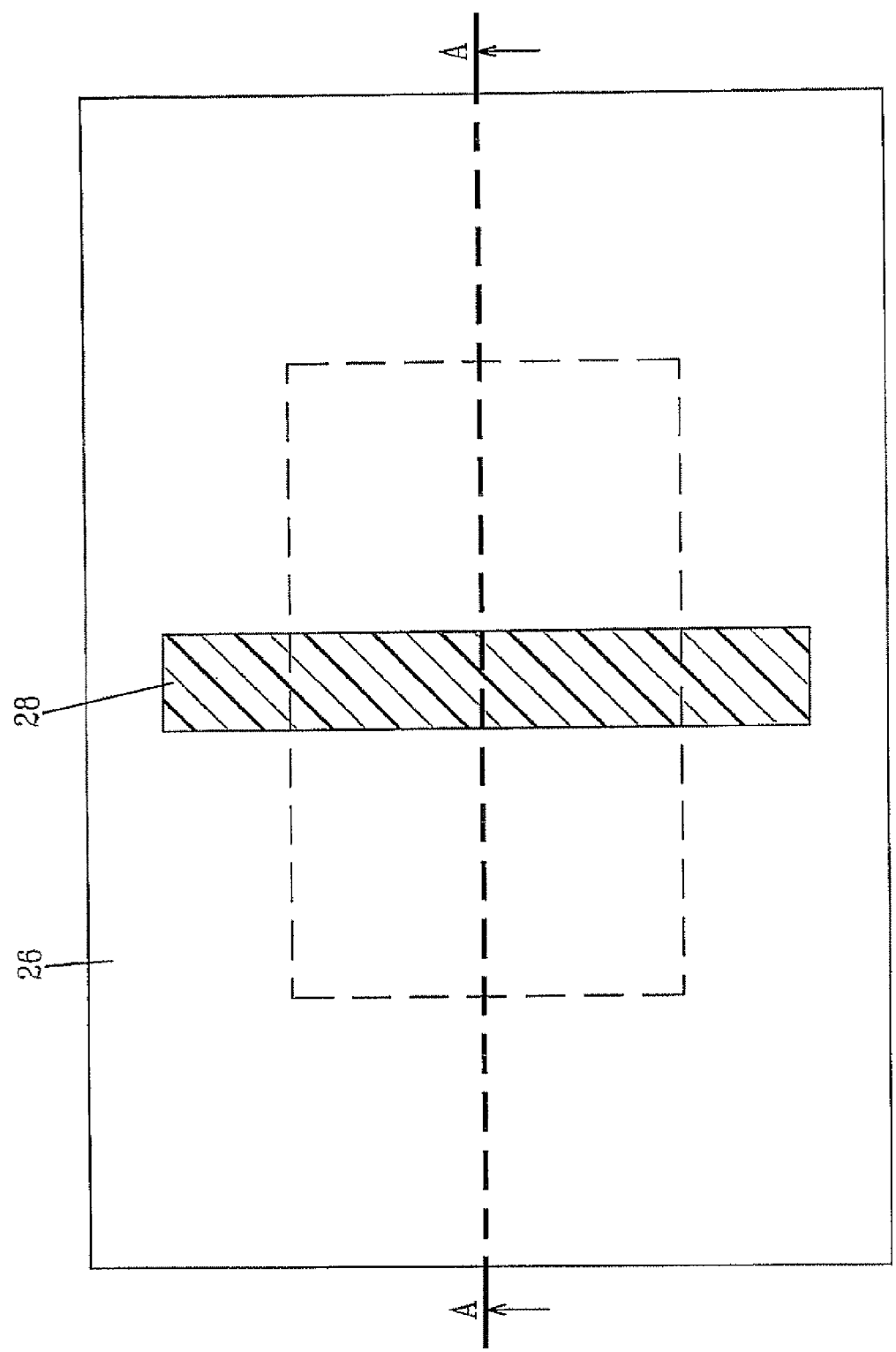
Figure 5B:
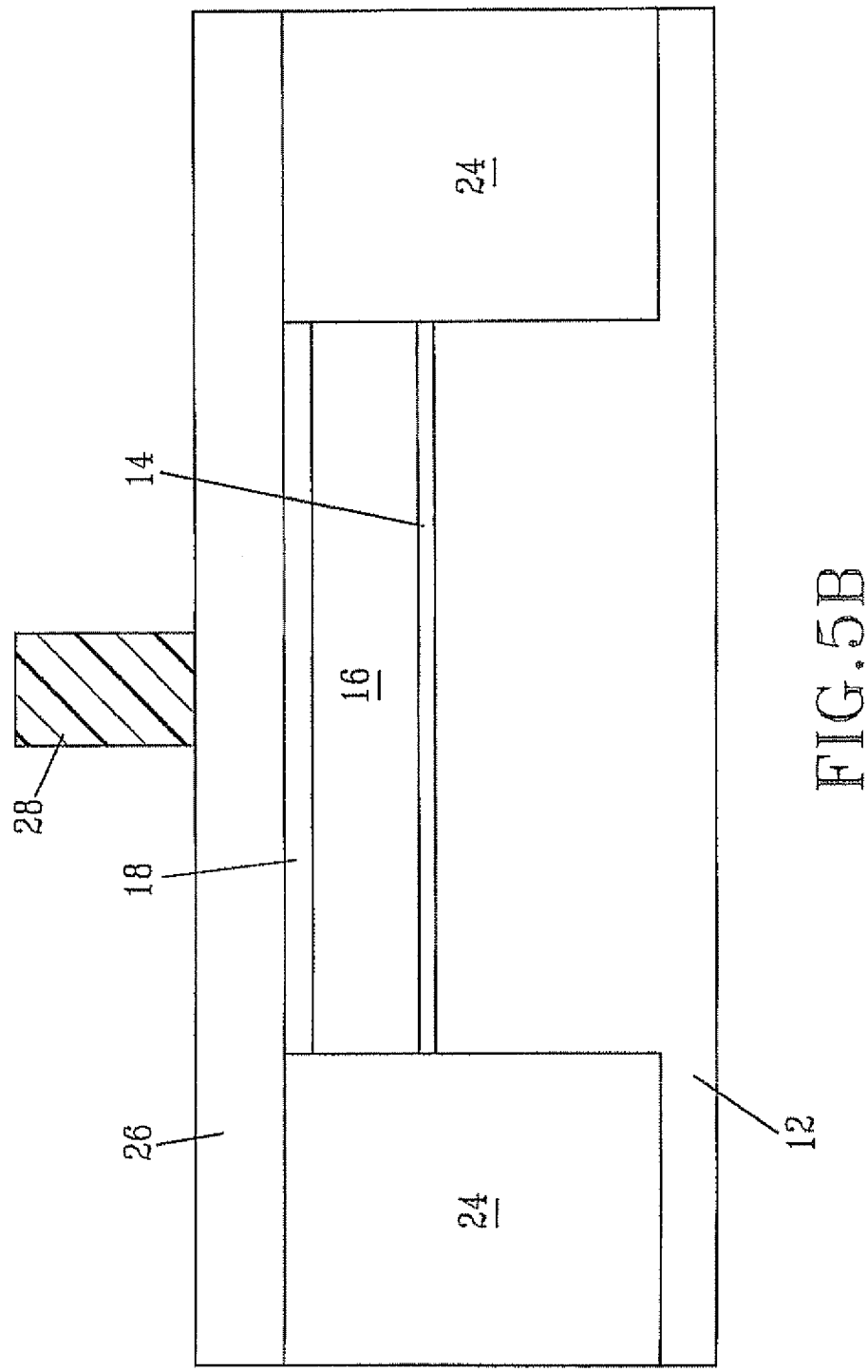

Specifically, the structure shown in FIGS. 4A-4B is formed by removing the patterned photoresist 20 from the structure utilizing a conventional resist stripping process well known to those skilled in the art. An example of a conventional resist stripping process that can be used to remove the patterned photoresist 20 from the structure is ashing. After removing the patterned photoresist 20 from the structure, the at least one trench 22 is filled with a trench dielectric material 24 such as $SiO_2$ or TEOS (tetraethyleorthosilicate) utilizing a deposition process. After filling of the at least one trench 22, a planarization process such as, for example, chemical mechanical polishing (CMP) and/or grinding is employed to provide the planar structure shown in FIGS. 4A-4B. An optional trench linear can be formed within the trench prior to trench dielectric fill, and an optional densification step may also be performed. It is noted that the at least one trench 22 filled with the trench dielectric material 24 forms a trench isolation region 102 within the structure. As shown, the trench isolation region 102 surrounds the active area AA of the inventive structure.

A second nitride layer 26 is then formed in the structure shown in FIGS. 4A-4B utilizing the same or different deposition technique that was used in forming first nitride layer 18. The thickness of the second nitride layer 26 is within the range recited above for the first nitride layer 18. Next, a second patterned photoresist 28 is formed on a surface of the second nitride layer 26 providing the structure shown, for example, in FIGS. 5A-5B. The second patterned photoresist 28 is formed utilizing the processing steps (i.e., deposition and lithography) as described above for the patterned photoresist 20. The second patterned photoresist 28, which has a width that is less than the width of the patterned photoresist 20, is employed in forming the width of the gate line. Generally, the width of the second photoresist 28 is from about 10 to about 100 nm, with a width from about 15 to about 40 nm being more highly preferred.

Figure 6A:
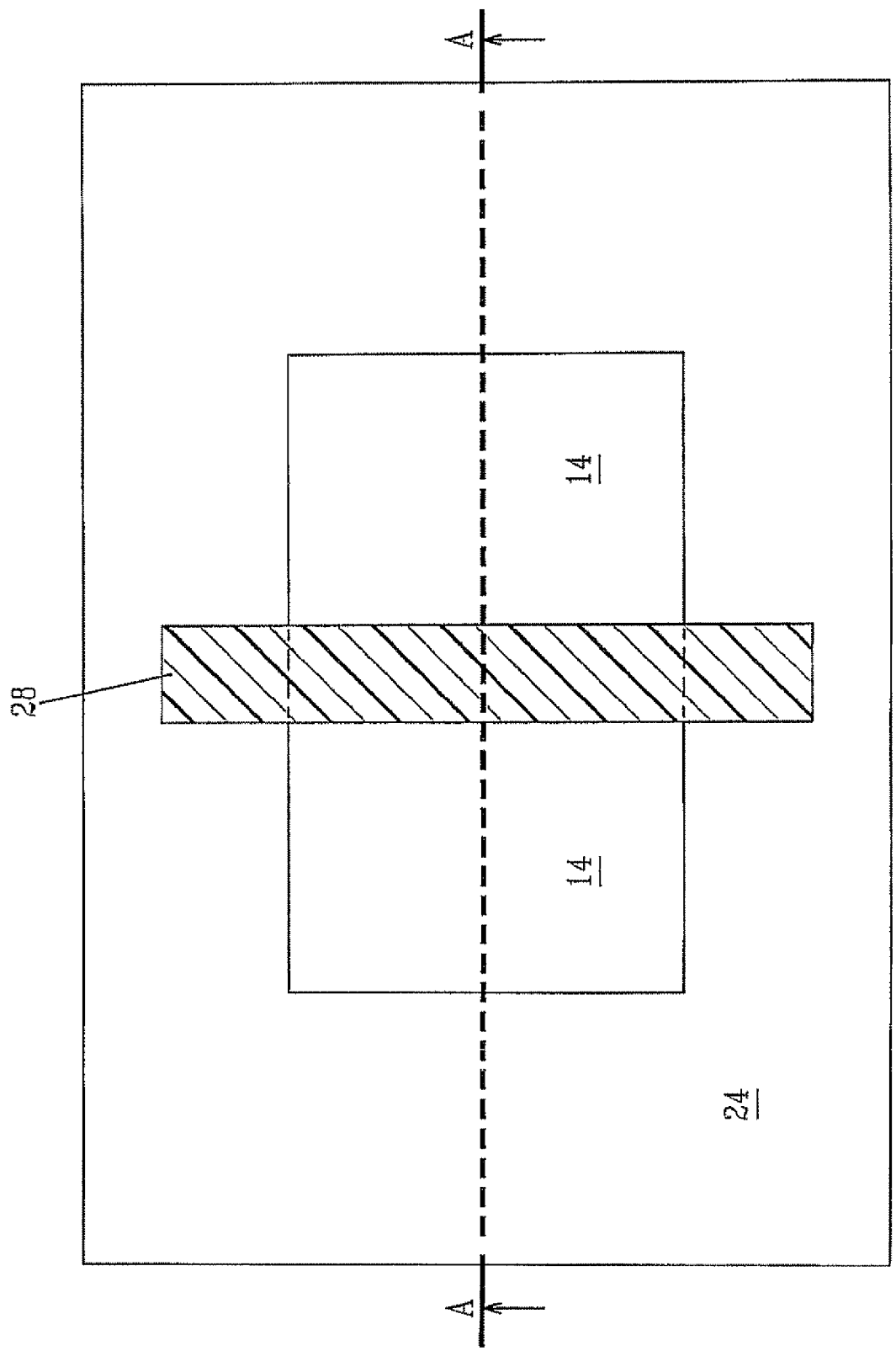
Figure 6B:
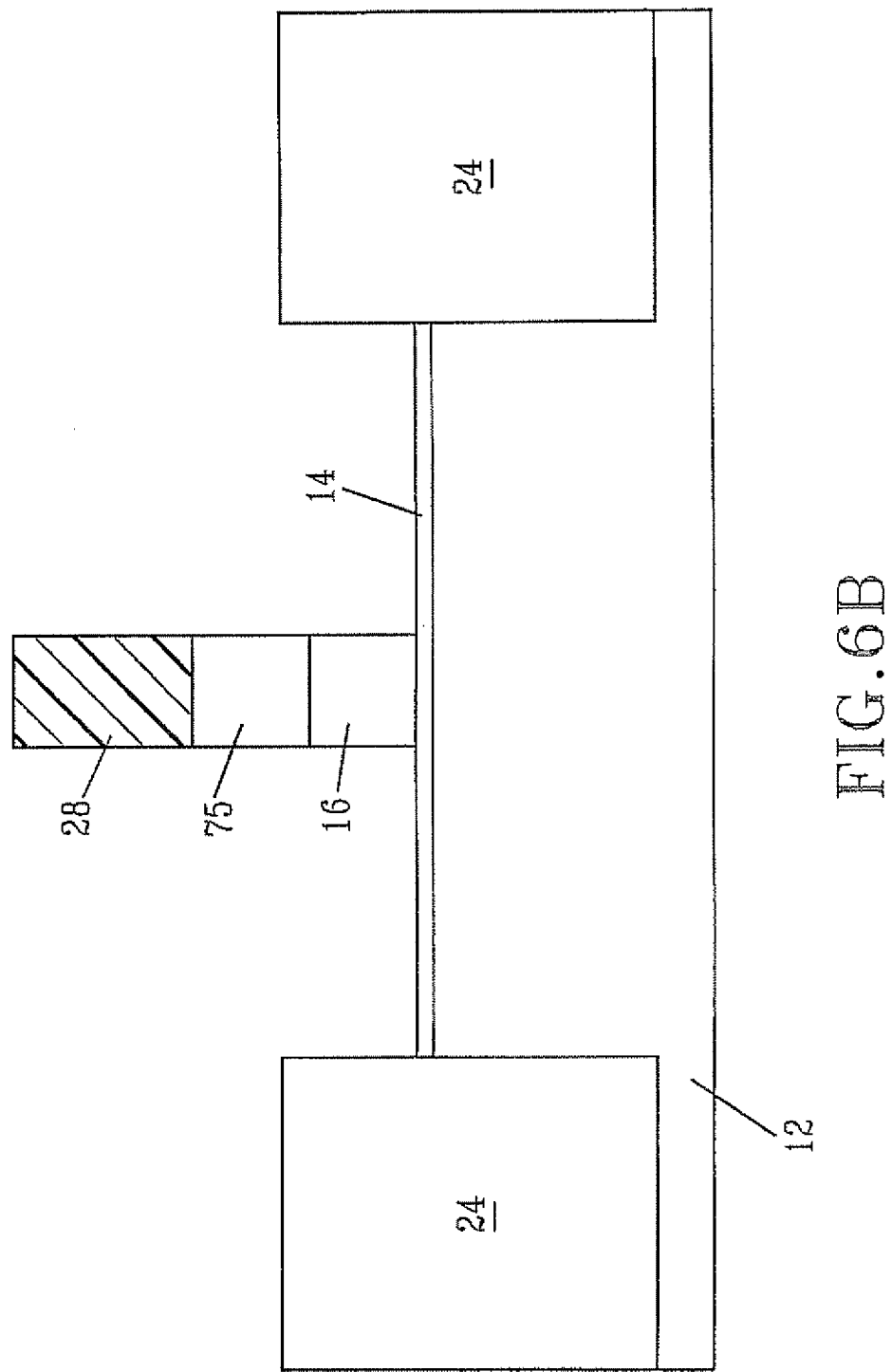

FIGS. 6A-6B illustrate the structure that is formed after removing exposed portions of the second nitride layer 26, underlying portions of the first nitride layer 18, and underlying portions of the SiGe layer 16, while stopping atop oxide layer 14. This removal step that is performed includes a dry etching process such as, for example, RIE. In FIG. 6B (and in some of the remaining drawings), reference numeral 75 denotes a nitride stack that includes the first and second nitride layers mentioned above.

Next, the second patterned photoresist 28 is removed from the structure utilizing a conventional resist stripping process such as ashing, and an angled implantation (as indicated by the arrows 30) is performed. Prior to performing the angled implant, the remaining SiGe layer 16, as shown in FIG. 6B, that is located beneath the nitride stack 75 (i.e., second nitride layer 26 and the first nitride layer 18) is removed utilizing an isotropic etching process such as, for example, $CF_4$ of $CHF_3$.

Figure 7:
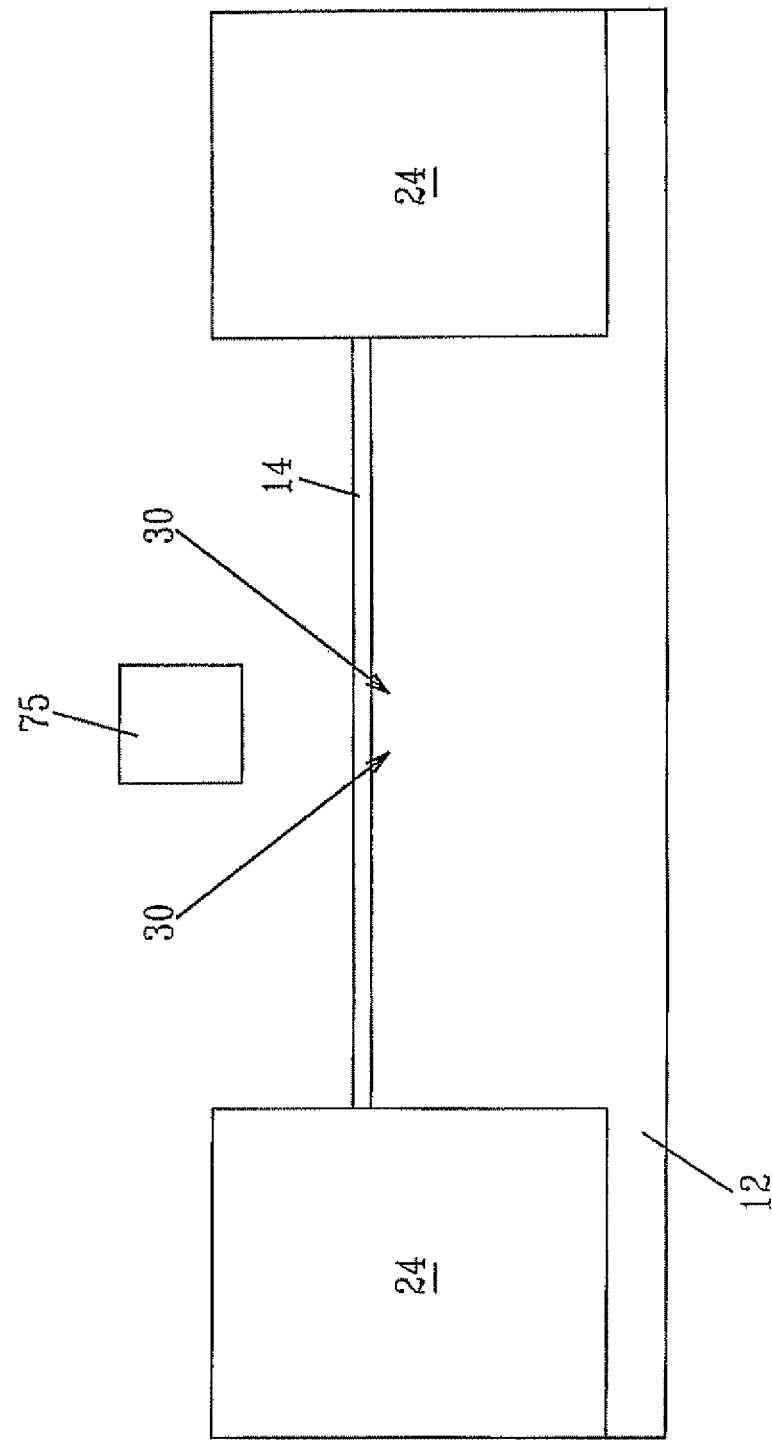

FIG. 7 illustrates the resultant structure during the angled implantation process.

The angled implantation utilized in the present invention comprises implanting a first conductivity type dopant (i.e., n-type or p-type) into the semiconductor substrate 12 (in both the left and right directions as shown) at an angle incident to substrate 12 of less than 60°, preferably less than 45°, and more preferably less than 35°. The angled implantation is typically performed utilizing a dopant dosage from about $10^{12}$ to about $5 \times 10^{14}$ atoms/cm$^2$, with a dopant dosage from about $10^{13}$ to about $2 \times 10^{14}$ atoms/cm$^2$ being even more typical. It is noted that the angled implanted performed is similar in some respects to a halo implantation. Typically, the angled implantation is performed at an energy from about 0.5 to about 30 keV, with an energy from about 0.5 to about 20 keV being even more typical.

Figure 8B:
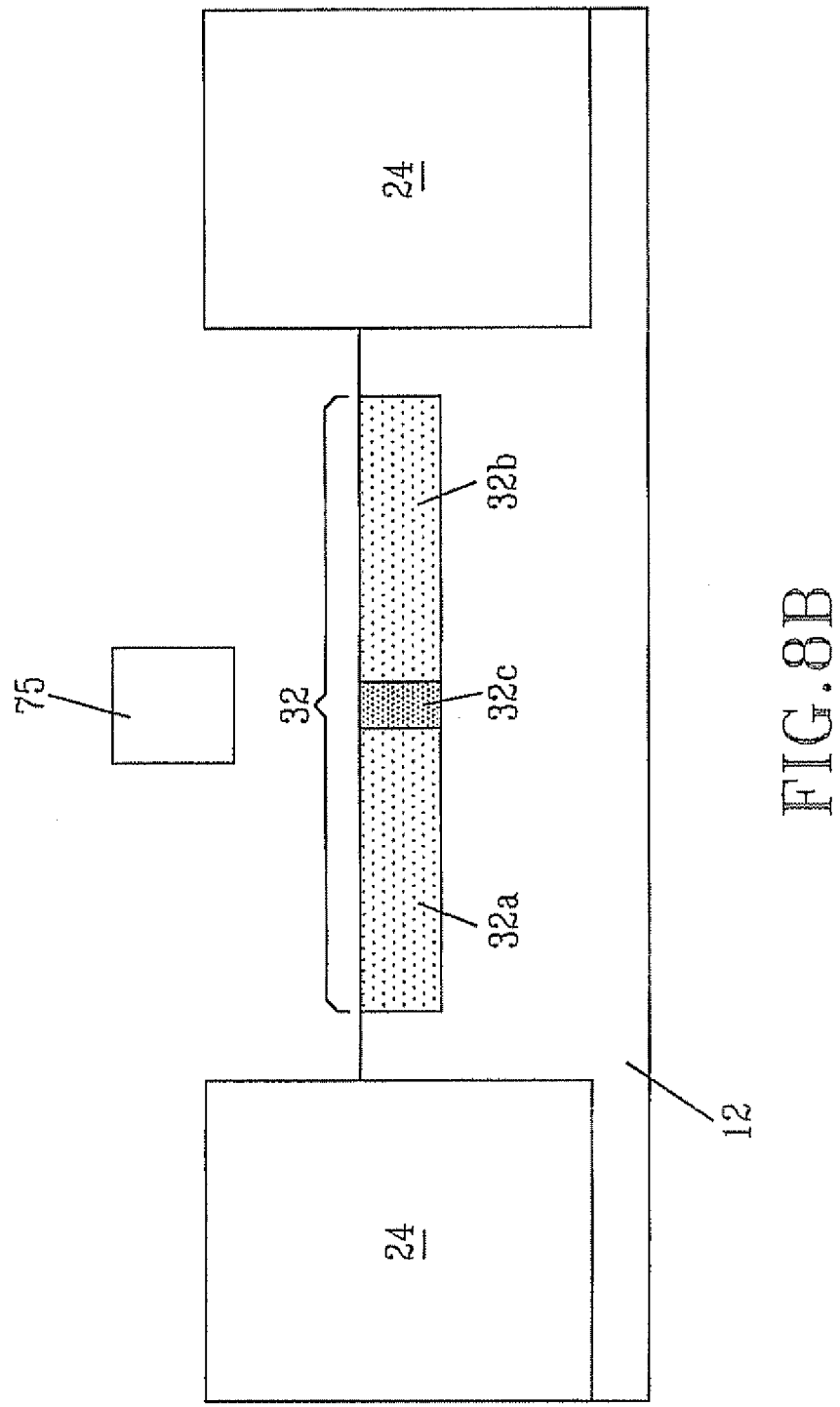

The angled implant performed at this point of the present invention forms a well region 32 within the semiconductor substrate 12 that will eventually form an abutting interface with the epitaxial semiconductor layer 34 to be subsequently formed. FIGS. 8A-8C show the presence of the well region 32. The well region 32 is of a first conductivity type (either n-type or p-type) and contains a central portion 32c and two horizontally abutting end portions 32a and 32b that are located to the left and right of the central portion 32c. The central portion 32c has a higher concentration of a first conductivity type dopant than the two horizontally abutting end portions 32a and 32b. The higher concentration within the central portion 32c of the inventive well region 32 is an artifact of the processing steps employed in the present invention.

In the present invention, the well region 32 of first conductivity type may include either an n-type dopant or a p-type dopant. As indicated above, the central portion 32c of the well region 32 has a higher concentration of first conductivity type dopants than the two horizontally abutting end portions 32a and 32b; the two horizontally end portions of the well region also include the first conductivity type dopant. Preferably, the central portion 32c has a dopant concentration from about $10^{18}$ to about $10^{19}$ atoms/cm$^3$, while the two horizontally abutting end portions 32a and 32b of the well region 32 have a dopant concentration from about $5 \times 10^{17}$ to about $5 \times 10^{18}$ atoms/cm$^3$. In an even more preferred embodiment of the present invention, the central portion 32c has a dopant concentration from about $2 \times 10^{18}$ to about $7 \times 10^{18}$ atoms/cm$^3$, while the two horizontally abutting end portions 32a and 32b of the well region 32 have a dopant concentration from about $10^{18}$ to about $2 \times 10^{18}$ atoms/cm$^3$.

It is observed that the interface between the central portion 32c of the inventive well region 32 and either the two horizontally abutting end portions 32a and 32b has a change of first conductivity type dopant concentration that is abrupt, i.e., super-steep. Typically, the dopant concentration at the aforementioned interface changes by a factor of 10 per about 5 to about 10 nm.

The oxide layer 14 is next removed from the structure utilizing an etching process that selectively removes oxide as compared to nitride or a semiconductor material. See FIGS. 8A-8C as well. For example, etching in dilute HF can be used to remove the oxide layer 14 from the structure.

The resultant structure that is formed after the above processing steps have been performed is shown in FIGS. 8A-8C. It is noted that the remaining nitride stack 75 (i.e., first nitride layer 18 and second nitride layer 26) is not free standing in the active area of the structure, but instead, the trench isolation region 102 holds the nitride stack 75 that crosses over the active area (See, FIGS. 8A and 8C).

Figure 9:
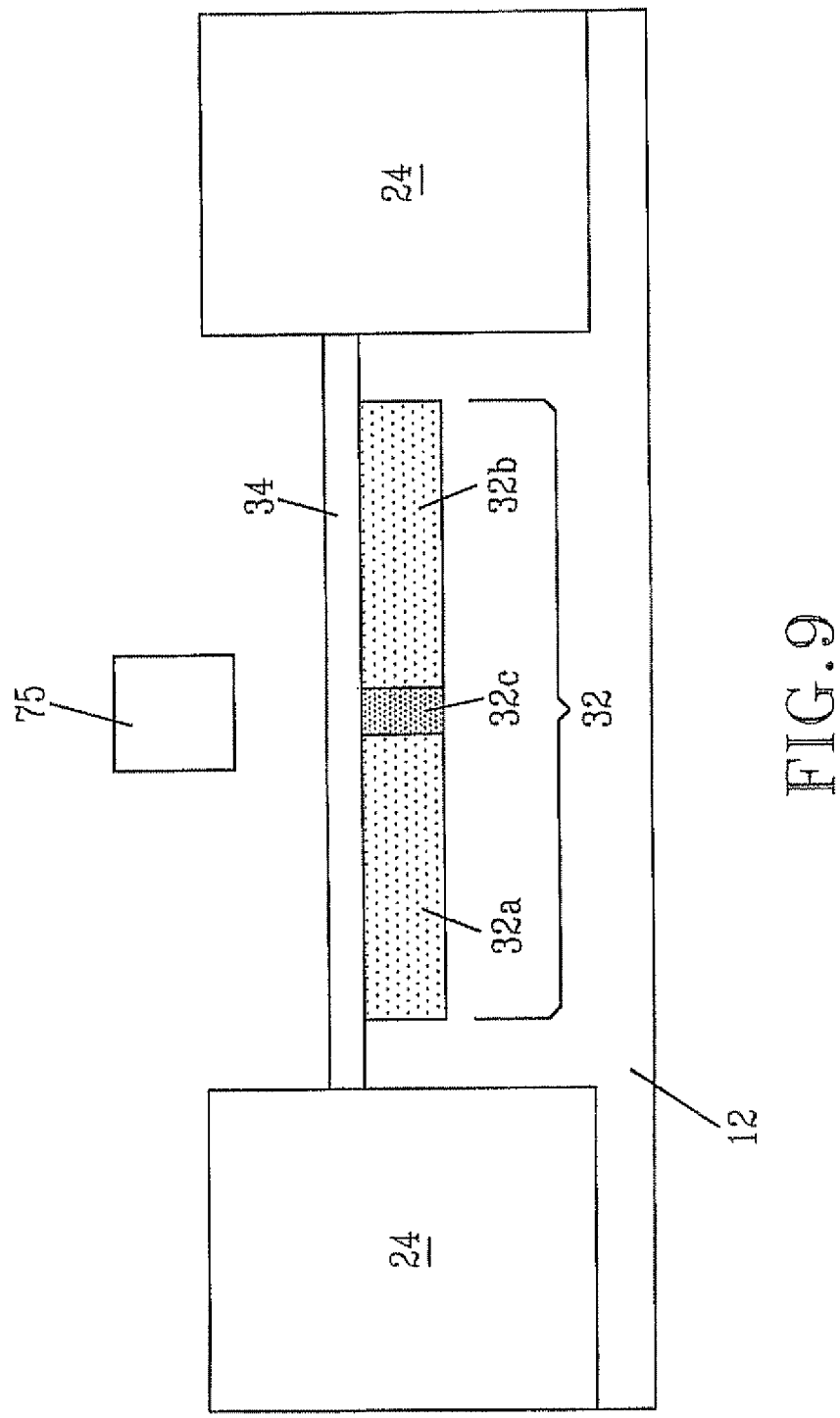

Next, and as shown in FIG. 9, an epitaxial semiconductor layer 34 is formed on the exposed portion of the semiconductor substrate 12 including atop the well region 32. Specifically, epitaxial semiconductor layer 34 is formed utilizing a conventional epitaxial growth process. Typically, the epitaxial semiconductor layer 34 is a Si-containing layer, with a layer of silicon being highly preferred. Since epitaxial growth is used in forming the epitaxial semiconductor layer 34, layer 34 has the same crystallographic orientation as that of semiconductor substrate 12. The thickness of the epitaxial semiconductor layer 34 is generally within a range from about 1 to about 50 nm, with a range from about 5 to about 20 nm being more preferred.

Figure 10:
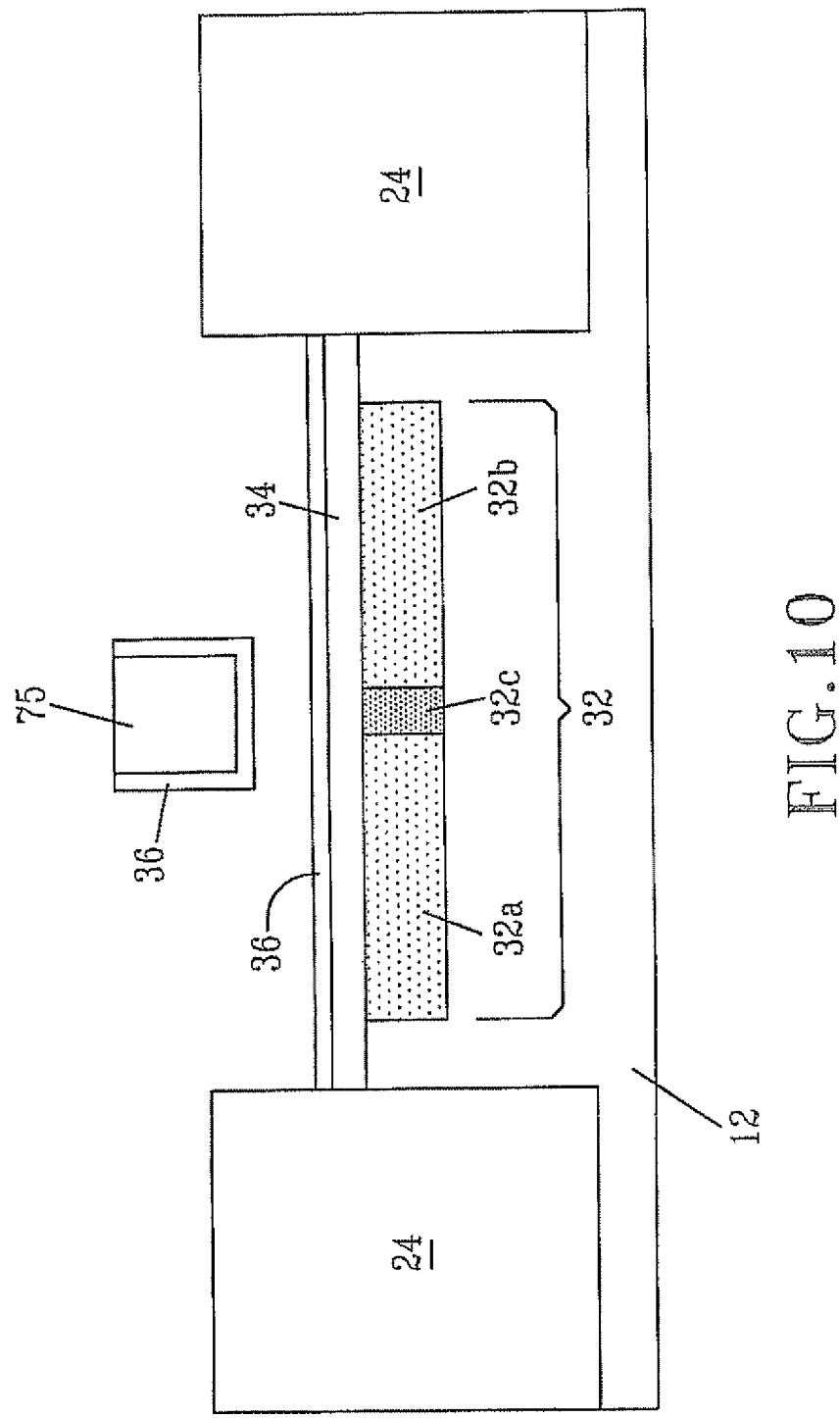

FIG. 10 illustrates the structure after forming a gate dielectric 36 on the exposed surfaces of the epitaxial semiconductor layer 34 as well exposed sidewalls and bottom wall of the nitride stack (i.e., nitride layers 18 and 26). The gate dielectric 36 can be formed by a thermal growing process such as, for example, oxidation, nitridation or a combination thereof. Alternatively, the gate dielectric 36 can be formed by a deposition process such as, for example, chemical vapor deposition (CVD), plasma-enhanced chemical vapor deposition (PECVD, atomic layer or pulsed deposition (ALD or ALPD), evaporation, reactive sputtering, chemical solution deposition or other like deposition processes. The gate dielectric 36 may also be formed utilizing any combination of the above processes.

The gate dielectric 36 is comprised of an insulating material having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 36 employed in the present invention includes, but is not limited to an oxide, nitride, oxynitride and/or silicates including metal silicates, aluminates, titanates and nitrides. In one embodiment, it is preferred that the gate dielectric 36 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof. In a preferred embodiment of the present invention, $HfO_2$ is employed as the gate dielectric material.

The physical thickness of the gate dielectric 36 may vary, but typically, the gate dielectric 36 has a thickness from about 0.5 to about 10 nm, with a thickness from about 0.5 to about 2 nm being more typical.

Figure 11:
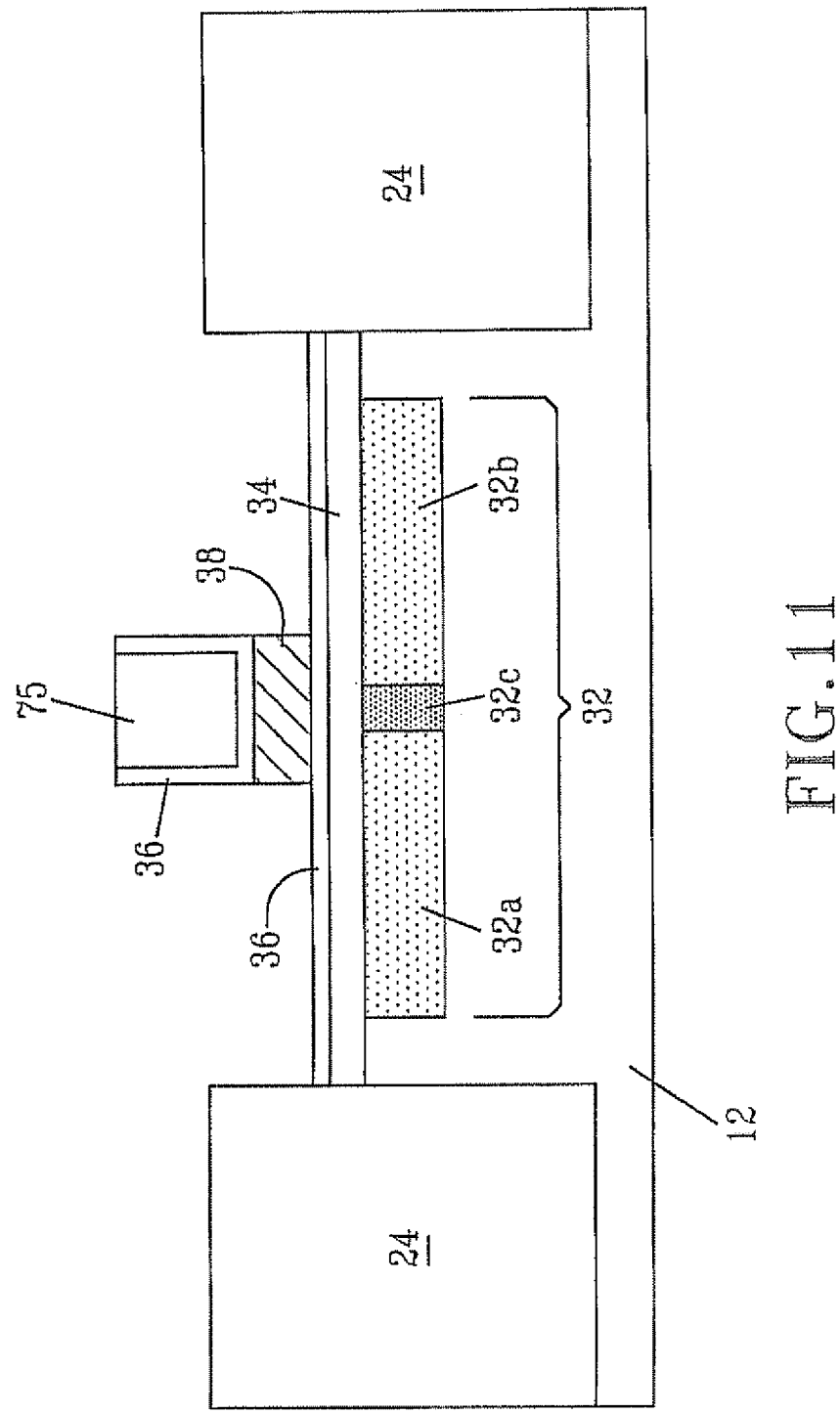

Next, a blanket layer of first conductive material is formed on the exposed surfaces of the structure shown in FIG. 10 and thereafter the blanket layer of first conductive material is etched selective to the gate dielectric 36 providing the structure shown, for example, in FIG. 11. As shown, the aforementioned processing steps provide a first gate electrode portion 38 beneath the gate dielectric lined nitride stack. The first gate electrode portion 38 has outer sidewall edges that are aligned to the outer surfaces of the gate dielectric 36 that is formed on the nitride stack.

The blanket layer of first conductive material is formed utilizing a known deposition process such as, for example, physical vapor deposition, CVD, sputtering, or evaporation. In some embodiments, the first conductive material used as the first gate electrode portion 38 is a Si-containing material such as Si or a SiGe alloy layer in either single crystal, polycrystalline or amorphous form. More preferably, the first conductive material used as the first gate electrode portion 38 is a conductive metal, a conductive metal alloy or a conductive metal nitride. When an nMOSFET is to be fabricated, TiN is used as the conductive material for the first gate electrode portion 38, when a pMOSFET is to be fabricated, W is used as the conductive material for the first gate electrode portion 38.

The blanket layer of first conductive material may be doped or undoped. If doped, an in-situ doping deposition process may be employed in forming the same. Alternatively, a first doped conductive material can be formed by deposition, ion implantation and annealing. The doping of the first conductive material will shift the workfunction of the gate conductor formed. Illustrative examples of dopant ions for nMOSFETs include elements from Group VA of the Periodic Table of Elements (Group IIIA elements can be used when pMOSFETs are formed).

After forming the blanket layer of first conductive material, a selective etching step is employed. An example of a selective etching process that can be used to selectively remove the conductive material relative to the gate dielectric material is HBr or $Cl_2$ plasma.

Figure 12:
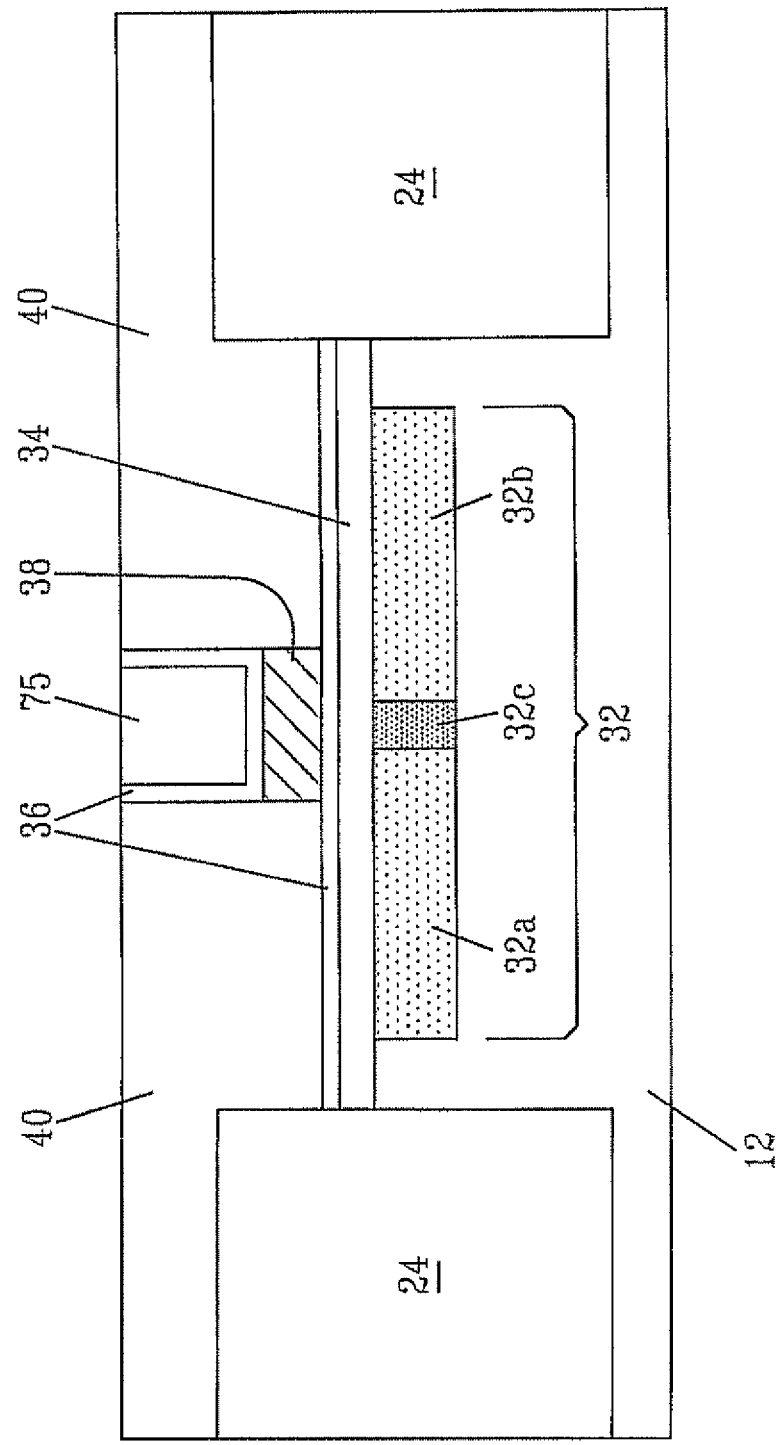

FIG. 12 illustrates the structure after forming a sacrificial material 40 on the structure shown in FIG. 11 and thereafter planarizing the sacrificial material 40 to the top of the nitride stack 75, i.e., to the upper surface of the second nitride layer 26. The sacrificial material 40 is typically an oxide such as, for example, an oxide of silicon, or a doped silicate glass. The sacrificial material 40 is formed utilizing any conventional deposition process including, for example, CVD, PECVD, spin-on coating, evaporation or chemical solution deposition. Planarization is achieved by chemical mechanical polishing and/or grinding.

Figure 13:
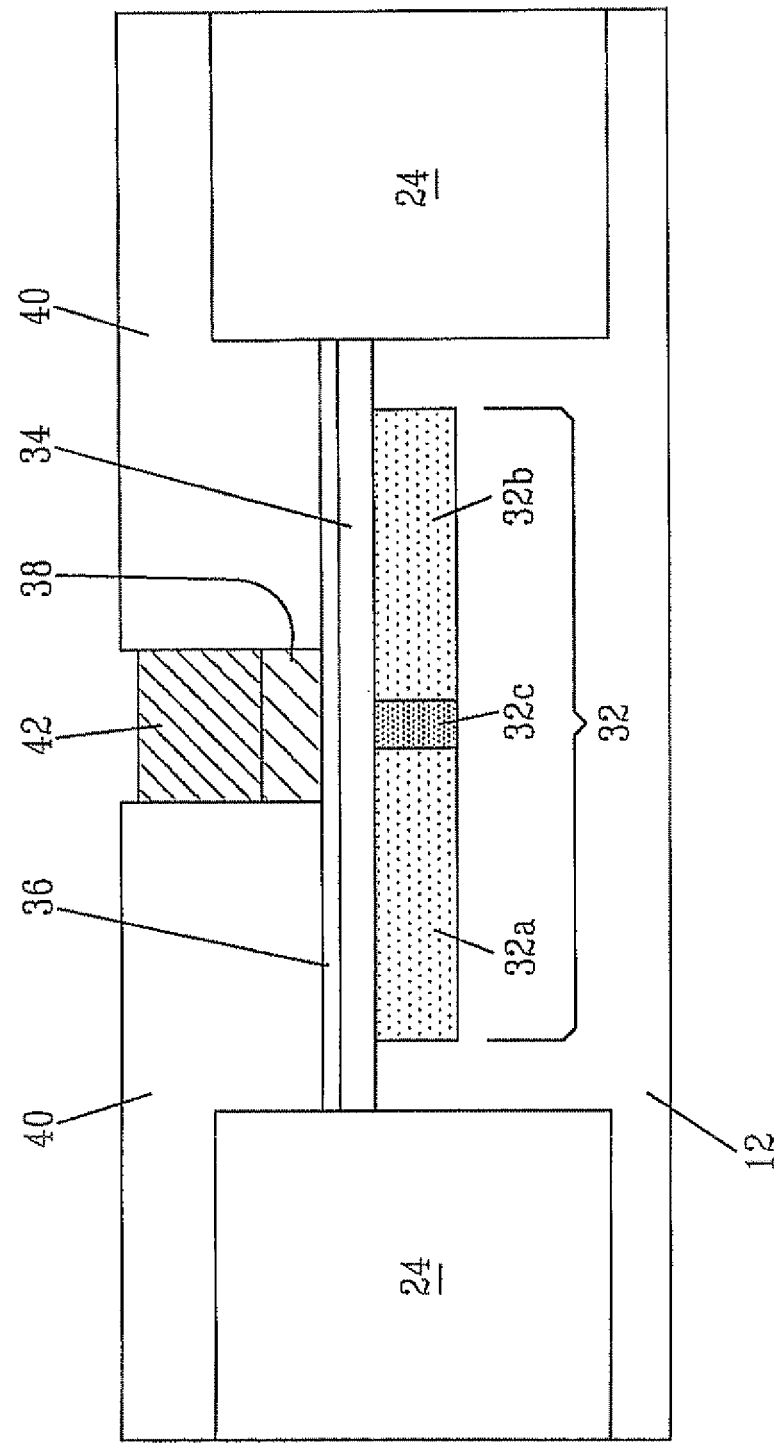

Next, the nitride stack 75 including second nitride layer 26 and first nitride layer 18 is removed from the structure utilizing a dry etching process such as, for example, reactive ion etching. After removing the nitride stack 75, the underlying gate dielectric 36 that was previously located on the sidewalls and bottom wall of the nitride stack is etched utilizing the same or different etching process as that used in removing the nitride stack. Next, a second gate electrode portion 42 is formed in the area previously occupied by the nitride stack 75 and the gate dielectric 36. The second gate electrode portion 42 abuts an upper surface of the first gate electrode portion 38, as shown in FIG. 13.

The second gate electrode portion 42 comprises a conductive material that is the same or different, preferably, different, from the conductive material present in the first gate electrode portion 38. Typically, but not necessarily always, the second gate electrode portion 42 is comprised of a Si-containing, i.e., polySi or SiGe, conductive material. In addition to Si-containing conductive materials, the second gate electrode portion may comprise a conductive metal, a conductive metal alloy, a conductive silicide or a conductive nitride. Combinations of these conductive materials are also contemplated.

Notwithstanding the conductive material used in the second gate electrode portion 42, the second gate electrode portion 42 is formed by a conventional deposition process including, for example, CVD, PECVD, plating, sputtering, evaporation and PVD. When polySi or SiGe is used, the doping of the second gate electrode portion 42 may occur in-situ or it may occur after deposition by utilizing an ion implantation process.

Following the formation of the second gate electrode portion 42, the second gate electrode portion 42 is recessed such that an upper surface thereof is beneath the upper surface of the sacrificial material 40. The resultant structure is shown, for example, in FIG. 13. The recessing of the second gate electrode portion 42 may include a timed chemical wet etching process or a timed dry etching process.

Figure 14:
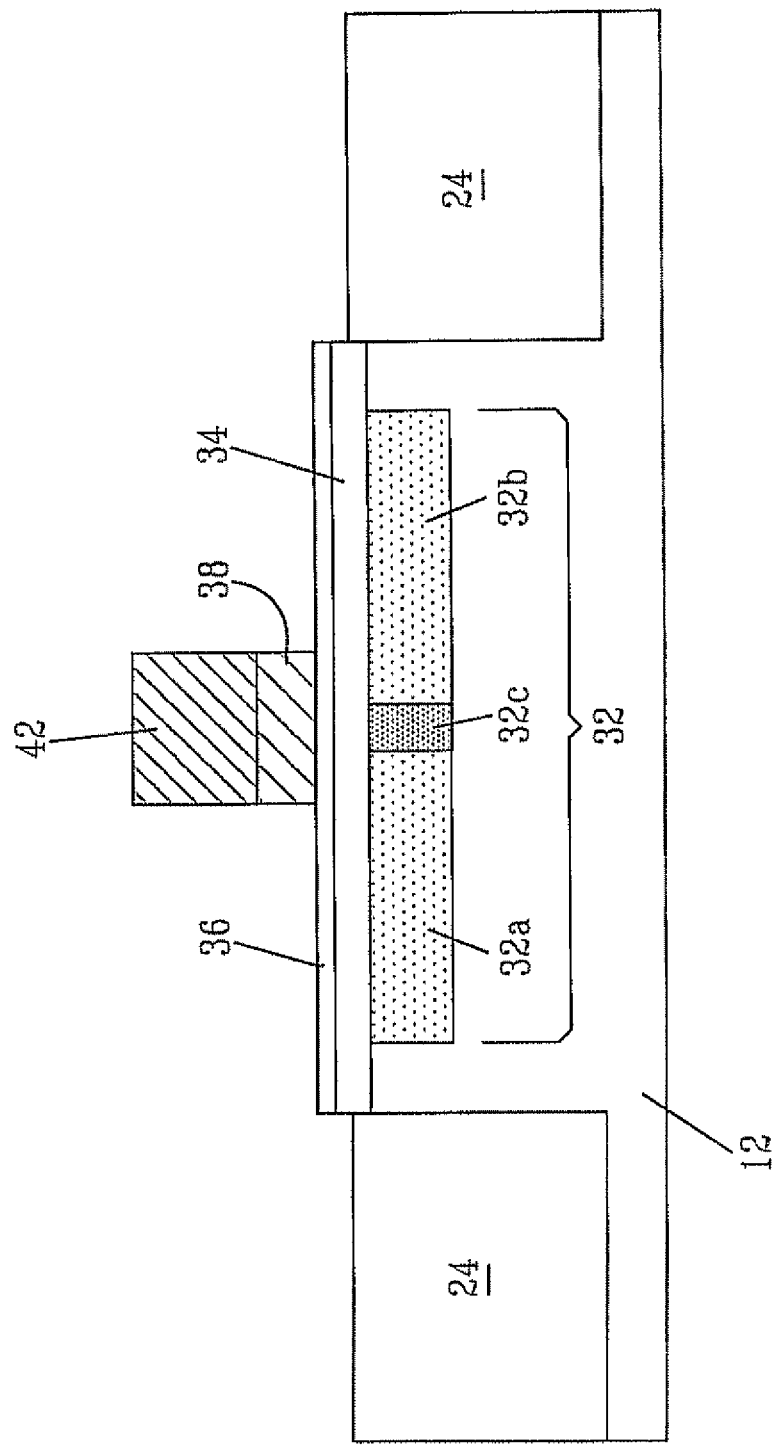

FIG. 14 illustrates the resultant structure that is formed after removing the sacrificial material 40 from the structure. The removal of the sacrificial material 40 is performed selective to the gate dielectric 36 and both gate electrode portions. Typically, and when the sacrificial material 40 comprises an oxide, BHF is used to selectively remove the sacrificial material 40 from the structure.

Figure 15:
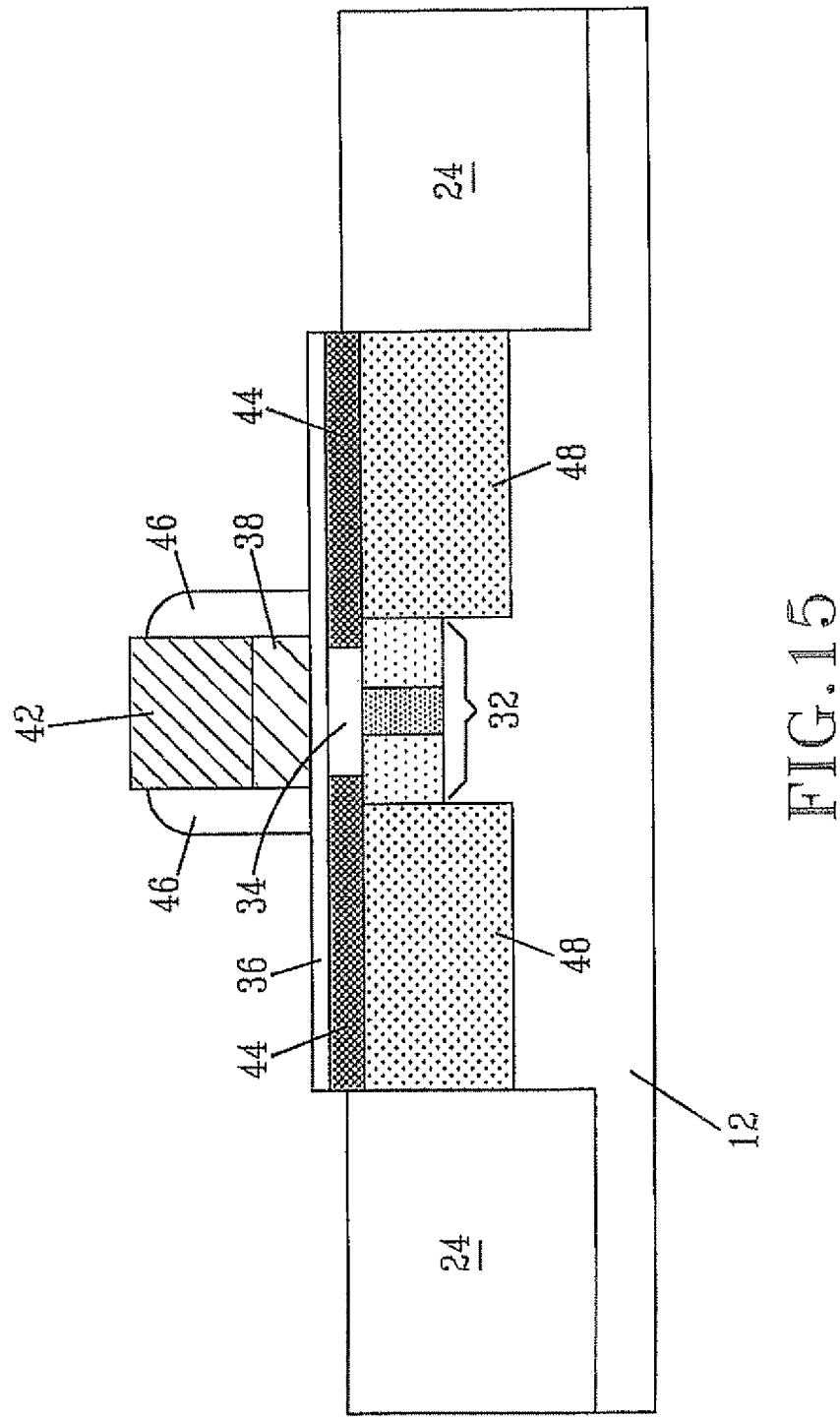

After removing the sacrificial material 40 from the structure, conventional CMOS processing including the formation of source/drain extension regions, at least one spacer, and source/drain diffusion regions is performed so as to provide the structure shown in FIG. 15. Specifically, source/drain extension regions 44 are formed into the epitaxial semiconductor layer 34 that does not include the overlying first and second gate electrode portions utilizing a conventional extension ion implantation process. An optional anneal process may follow the extension ion implant. In some embodiments of the present invention and prior to formation of the source/drain extension regions, a gate reoxidation process can be performed to provide a thin oxide (not shown) on the sidewalls of the first and second gate electrode portions.

Next, at least one spacer 46 is formed by deposition and etching. The at least one spacer 46 comprises a dielectric material including, for example, an oxide, a nitride or an oxynitride. Typically, the at least one spacer 46 comprises an oxide of silicon and/or a nitride of silicon. The at least one spacer 46 must be sufficiently wide enough such that the source and drain metal semiconductor alloy layer (to be subsequently formed) does not encroach underneath the edges of the first and second gate electrode portions. Typically, the source/drain metal semiconductor alloy layers do not encroach underneath the edges of the first and second gate electrode portions when the at least one spacer 46 has a width, as measured at the bottom, from about 15 to about 200 nm.

After the at least one spacer 46 formation, source/drain diffusion regions 48 are formed into the semiconductor substrate 12. The source/drain diffusion regions 48 are formed utilizing ion implantation and an annealing step. The annealing step serves to activate the dopants that were implanted by the previous implant step (or steps if annealing was not previously been performed to activate the dopants within the extension implant regions). At this point of the present invention, a buffer implant may be performed to provide the source/drain regions with a graded junction that optimizes the series resistance of the device. As indicated above, the source/drain diffusion regions 48 are of a second conductivity type which is different than the first conductivity type.

Next, the gate dielectric 36 located on the surface of the semiconductor substrate 12 is removed utilizing a conventional etching process such as, for example, BHF for oxide or $BCl_3$ for $HfO_2$. After removing the exposed portions of the gate dielectric not protected by the at least one spacer and first and second gate electrode portions, a metal semiconductor alloy 50 is formed at least within the area of the structure including the source/drain diffusions. See FIG. 1. In some embodiments, and when the second gate electrode portion 42 comprises a Si-containing material, a metal semiconductor alloy 50' can also be formed within an upper surface of the second gate electrode portion 42.

The metal semiconductor alloy 50 and 50' which are comprised of the same metal semiconductor alloy are formed utilizing a conventional salicidation method well known to those skilled in the art. First, a metal that is capable of thermally reacting with a semiconductor material and/or a Si-containing conductive material is deposited atop the structure. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary. Typically, and for applications in FETs, the metal that is deposited has a thickness from about 5 to about 15 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Typically, the anneal is a rapid thermal anneal in which the anneal time is about typically less than a minute. Following the final anneal step, any unreacted metal is removed from the structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:

providing a semiconductor structure having an oxide layer and at least one patterned material stack located on an active area of a semiconductor substrate, said semiconductor substrate having at least one trench isolation region that extends above the surface of said oxide layer;

performing an angled implantation process which forms a well region of a first conductivity type within the semiconductor substrate at an interface with said oxide layer, wherein the well region has a central portion and two horizontally abutting end portions, said central portion having a higher concentration of a first conductivity type dopant than the two horizontally abutting end portions;

removing a lower portion of said at least one patterned material stack, while maintaining an upper portion of said at least one patterned material stack;

removing said oxide layer to expose said semiconductor substrate within said active area;

forming an epitaxial semiconductor layer on said exposed semiconductor substrate;

forming a gate dielectric on said epitaxial semiconductor layer and on exposed sidewalls and bottom wall of said upper portion of said at least one patterned material stack;

forming a first gate electrode portion on a surface of said epitaxial semiconductor layer, wherein a top surface of said first gate electrode portion abuts said gate dielectric on said bottom wall of said upper portion of said at least one patterned material stack;

removing the upper portion of said at least one patterned material stack and said gate dielectric located on said sidewalls and said bottom wall of said upper portion of said at least one patterned material stack; and forming a second gate electrode portion on an upper surface of said first gate electrode portion.

2. The method of claim 1 wherein said central portion of said well region has a dopant concentration from about $10^{18}$ to about $10^{19}$ atoms/cm$^3$ and said two horizontally abutting end portions of said well region have a dopant concentration from about $5\times10^{17}$ to about $5\times10^{18}$ atoms/cm$^3$.

3. The method of claim 1 wherein said central portion of said well region has a dopant concentration from about $2\times10^{18}$ to about $7\times10^{18}$ atoms/cm$^3$ and said two horizontally abutting end portions of said well region have a dopant concentration from about $10^{18}$ to about $3\times10^{18}$ atoms/cm$^3$.

4. The method of claim 1 wherein said central portion forms an abutting interface with each end portion, said abutting interface has a change in dopant concentration that is on an order of about 10 per about 5 to about 10 nm.

5. The method of claim 1 wherein said angled implantation process is performed at an angle incident to the semiconductor substrate of less than 60°.

6. The method of claim 5 wherein said angled implantation process is performed at an energy from about 0.5 to about 30 keV.

7. The method of claim 6 wherein said angled implantation process is performed utilizing an ion dose from about $10^{12}$ to about $5\times10^{14}$ atoms/cm$^2$.

8. The method of claim 1 wherein said lower portion of said at least one patterned material stack comprises SiGe and said upper portion comprises a material stack of a first nitride layer and a second nitride layer.

9. The method of claim 1 wherein said SiGe is removed by an isotropic etching process and said upper portion is supported by said at least one trench isolation region.

10. The method of claim 1 wherein said angled implantation process is performed at an angle of less than 35°.

11. The method of claim 1 said removing said oxide layer comprises an etching process.

12. The method of claim 1 wherein said forming said epitaxial semiconductor layer comprises epitaxial growth of a semiconductor material from said exposed semiconductor substrate, wherein said semiconductor material has a same crystallographic orientation as that of said exposed semiconductor substrate.

13. The method of claim 1 said central portion does not extend beyond vertical sidewalls of said first and second gate electrode portions.

14. The method of claim 1 a portion of the two horizontal horizontally abutting end portions extends under the first and second gate electrode portions.

15. The method of claim 1 wherein said at least one trench isolation region has a bottommost surface which is located at a depth within the semiconductor substrate which is deeper than the bottommost surfaces of the central portion and the two horizontal abutting end portions of the well region.

16. The method of claim 1 wherein said central portion has a bottommost surface that is co-planar with the bottommost surfaces of the two horizontally abutting end portions.

17. The method of claim 1 wherein said central portion of said well region is entirely spaced apart from said at least one trench isolation region.

18. The method of claim 1 wherein said first gate electrode portion and said second electron portion are vertically coincident to each other.

* * * * *